(12) United States Patent
Zhong et al.

(10) Patent No.: US 7,858,996 B2
(45) Date of Patent: Dec. 28, 2010

(54) METHOD FOR GROWTH OF SEMIPOLAR (AL,IN,GA,B)N OPTOELECTRONIC DEVICES

(75) Inventors: Hong Zhong, Temple City, CA (US); John F. Kaeding, Mountain View, CA (US); Rajat Sharma, Goleta, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 56 days.

(21) Appl. No.: 11/676,999

(22) Filed: Feb. 20, 2007

(65) Prior Publication Data

US 2007/0252164 A1 Nov. 1, 2007

Related U.S. Application Data

(60) Provisional application No. 60/774,467, filed on Feb. 17, 2006.

(51) Int. Cl.
*H01L 33/00* (2010.01)
(52) U.S. Cl. .............................. 257/98; 257/79; 257/94; 257/103; 257/E51.018
(58) Field of Classification Search .................... 257/79, 257/94, 98, 103
See application file for complete search history.

(56) References Cited

U.S. PATENT DOCUMENTS

| 5,591,666 | A | 1/1997 | Shiralagi et al. |
| 5,685,904 | A | 11/1997 | Pizone |
| 6,072,197 | A | 6/2000 | Horino et al. |
| 6,086,670 | A | 7/2000 | Ito |
| 6,153,010 | A | 11/2000 | Kiyoku et al. |
| 6,258,459 | B1 | 7/2001 | Noguchi et al. |
| 6,593,589 | B1 * | 7/2003 | Osinski et al. ................ 257/22 |
| 6,599,362 | B2 | 7/2003 | Ashby et al. |
| 6,828,591 | B2 * | 12/2004 | Okuyama et al. ............. 257/89 |
| 6,847,057 | B1 | 1/2005 | Gardner et al. |
| 7,220,324 | B2 | 5/2007 | Baker et al. |

(Continued)

FOREIGN PATENT DOCUMENTS

WO 2007030709 3/2007

OTHER PUBLICATIONS

International Search Report for PCT Application No. PCT/US2007/04533.

(Continued)

*Primary Examiner*—Wai-Sing Louie
(74) *Attorney, Agent, or Firm*—Gates & Cooper LLP

(57) ABSTRACT

A method of fabricating an optoelectronic device, comprising growing an active layer of the device on an oblique surface of a suitable material, wherein the oblique surface comprises a facetted surface. The present invention also discloses a method of fabricating the facetted surfaces. One fabrication process comprises growing an epitaxial layer on a suitable material, etching the epitaxial layer through a mask to form the facets having a specific crystal orientation, and depositing one or more active layers on the facets. Another method comprises growing a layer of material using a lateral overgrowth technique to produce a facetted surface, and depositing one or more active layers on the facetted surfaces. The facetted surfaces are typically semipolar planes.

43 Claims, 19 Drawing Sheets

U.S. PATENT DOCUMENTS

| | | | |
|---|---|---|---|
| 2001/0050376 A1* | 12/2001 | Shibata et al. | 257/190 |
| 2004/0087115 A1* | 5/2004 | Nagai et al. | 438/481 |
| 2005/0039673 A1* | 2/2005 | Ishida | 117/90 |
| 2005/0155544 A1 | 7/2005 | Okahisa | |
| 2005/0217565 A1 | 10/2005 | Lahreche et al. | |
| 2005/0224781 A1 | 10/2005 | Kneissl et al. | |
| 2005/0266693 A1 | 12/2005 | Maekawa | |
| 2006/0175624 A1 | 8/2006 | Sharma et al. | |
| 2006/0237709 A1* | 10/2006 | Lee et al. | 257/11 |
| 2007/0015345 A1 | 1/2007 | Baker et al. | |
| 2007/0093073 A1 | 4/2007 | Farrell et al. | |
| 2007/0111531 A1 | 5/2007 | Baker et al. | |

OTHER PUBLICATIONS

Nishizuka, K. et al., "Efficient radiative recombination from {1122}-oriented $In_xGa_{1-x}N$ multiple quantum wells fabricated by the regrowth technique," Appl. Phys. Lett. 85(15), pp. 3122-3124 (2004).

Nishizuka, K. et al., "Efficient rainbow color luminescence from $In_xGa_{1-x}N$ single quantum wells fabricated on {1122} microfacets," Appl. Phys. Lett. 87, pp. 231901-231901-3 (2005).

Sharma, R. et al., "Demonstration of a semipolar {1013} InGaN/GaN green light emitting diode," Appl. Phys. Lett. 87, pp. 231110-23111-3 (2005).

Baker, T.J. et al., "Characterization of Planar Semipolar Gallium Nitride Films on Spinel Substrates," Jpn. J. of Appl. Phys. 44(29):L920-L922 (2005).

McLaurin, M. et al., "Molecular-beam epitaxy of p-type m-plane GaN," Appl. Phys. Lett. 86, pp. 262104-262104-3 (2005).

Romanov, A. et al., "Modeling the extended defect evolution in lateral epitaxial overgrowth of GaN: subgrain stability," J. Appl. Phys. 93(1):106-114 (2003).

Fini, P., "Threading Dislocation Reduction in Gallium Nitride Thin Films on Sapphire Via Lateral Epitaxial Overgrowth," PhD Thesis, University of California, Department of Engineering, pp. 1-209 (2000).

Tojyo, T. et al., "GaN-Based High Power Blue-Violet Laser Diodes," Jpn. J. Appl. Phys. 40, pp. 3206-3210 (2001).

Nakamura, S. et al., "The Blue Laser Diode—the complete story," Springer, 2nd edition, p. 280 (2000).

Shao, Y. et al., "Electrical Characterization of Semipolar Gallium Nitride Thin Films", NNIN REU Research Accomplishments, 2005, pp. 132-133.

Kamiyama, S. et al., "GaN growth on (30-38) 4H-SiC substrate for reduction of internal polarization", Phys. Stat. Sol. (c) 2, No. 7, 2121-2124 (2005).

* cited by examiner

FIG. 2

METHOD FOR GROWTH OF SEMIPOLAR (AL,IN,GA,B)N OPTOELECTRONIC DEVICES

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B) N OPTOELECTRONICS DEVICES,";

which application is incorporated by reference herein.

This application is related to the following co-pending and commonly-assigned applications:

U.S. Utility patent application Ser. No. 11/054,271, filed Feb. 9, 2005, by Rajat Sharma, Paul M. Pattison, John F. Kaeding, and Shuji Nakamura, entitled "SEMICONDUCTOR LIGHT-EMITTING DEVICE,";

U.S. Utility patent application Ser. No. 11/372,914 filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," which application claims the benefit under 35 U.S.C. Section 119(e) of U.S. Provisional Patent Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility patent application Ser. No. 11/444,946, filed Jun. 1, 2006, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES," which application claims the benefit under 35 U.S.C. Section 119(e) of U.S. Provisional Patent Application Ser. No. 60/686,244, filed Jun. 1, 2005, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES,";

U.S. Utility patent application Ser. No. 11/486,224, filed Jul. 13, 2006, by Troy J. Baker, Benjamin A. Haskell, James S. Speck and Shuji Nakamura, entitled "LATERAL GROWTH METHOD FOR DEFECT REDUCTION OF SEMIPOLAR NITRIDE FILMS," which application claims the benefit under 35 U.S.C. Section 119(e) of U.S. Provisional Patent Application Ser. No. 60/698,749, filed Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS,";

U.S. Utility patent application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION," which application claims the benefit under 35 U.S.C. Section 119(e) of U.S. Provisional Patent Application Ser. No. 60/715,491, filed Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Utility patent application Ser. No. 11/523,286, filed on Sep. 18, 2006, by Siddharth Rajan, Chang Soo Suh, James S. Speck and Umesh K. Mishra, entitled "N-POLAR ALUMINUM GALLIUM NITRIDE/GALLIUM NITRIDE ENHANCEMENT-MODE FIELD EFFECT TRANSISTOR," which application claims the benefit under 35 U.S.C. Section 119(e) of U.S. Provisional Patent Application Ser. No. 60/717,996, filed on Sep. 16, 2005, by Siddharth Rajan, Chang Soo Suh, James S. Speck and Umesh K. Mishra, entitled "N-POLAR ALUMINUM GALLIUM NITRIDE/ GALLIUM NITRIDE ENHANCEMENT-MODE FIELD EFFECT TRANSISTOR,";

U.S. Utility patent application Ser. No. 11/655,573, filed on Jan. 19, 2007, by John Kaeding, Dong-Seon Lee, Michael Iza, Troy J. Baker, Hitoshi Sato, Benjamin A. Haskell, James S. Speck, Steven P. Denbaars and Shuji Nakamura, entitled "METHOD FOR IMPROVED GROWTH OF SEMIPOLAR (Al,In,Ga,B)N," which application claims the benefit under 35 U.S.C. Section 119(e) of U.S. Provisional Patent Application Ser. No. 60/760,739, filed on Jan. 20, 2006, by John Kaeding, Michael Iza, Troy J. Baker, Hitoshi Sato, Benjamin A. Haskell, James S. Speck, Steven P. Denbaars and Shuji Nakamura, entitled "METHOD FOR IMPROVED GROWTH OF SEMIPOLAR (Al,In,Ga,B)N,";

U.S. Utility patent application Ser. No. 11/655,572, filed on Jan. 19, 2007, by Hitoshi Sato, John Kaeding, Michael Iza, Troy J. Baker, Benjamin A. Haskell, Steven P. DenBaars and Shuji Nakamura, entitled "METHOD FOR ENHANCING GROWTH OF SEMIPOLAR (Al,In,Ga,B)N VIA METALORGANIC CHEMICAL VAPOR DEPOSITION," which application claims the benefit under 35 U.S.C. Section 119(e) of U.S. Provisional Patent Application Ser. No. 60/760,628 filed on Jan. 20, 2006, by Hitoshi Sato, John Kaeding, Michael Iza, Troy J. Baker, Benjamin A. Haskell, Steven P. DenBaars and Shuji Nakamura entitled "METHOD FOR ENHANCING GROWTH OF SEMIPOLAR (Al,In,Ga,B)N VIA METALORGANIC CHEMICAL VAPOR DEPOSITION";

U.S. Provisional Patent Application Ser. No. 60/772,184, filed on Feb. 10, 2006, by John F. Kaeding, Hitoshi Sato, Michael Iza, Hirokuni Asamizu, Hong Zhong, Steven P. DenBaars and Shuji Nakamura, entitled "METHOD FOR CONDUCTIVITY CONTROL OF SEMIPOLAR (Al,In,Ga, B)N,";

U.S. Provisional Patent Application Ser. No. 60/798,933, filed on May 9, 2006, by Arpan Chakraborty, Kwang-Choong Kim, Steven P. DenBaars, James S. Speck, and Umesh K. Mishra, entitled "TECHNIQUE FOR DEFECT REDUCTION IN NONPOLAR AND SEMIPOLAR GALLIUM NITRIDE FILMS USING IN-SITU SILICON NITRIDE NANOMASKING,";

U.S. Provisional Patent Application Ser. No. 60/809,774, filed on May 31, 2006, by Nicholas A. Fichtenbaum, Umesh K. Mishra, Carl J. Neufeld and Stacia Keller, entitled "OPTO-ELECTRONIC DEVICES FORMED BY REGROWTH ON N-POLAR NANOPILLAR AND NANOSTRIPE ARRAYS,";

U.S. Provisional Patent Application Ser. No. 60/866,035, filed on Nov. 15, 2006, by Stacia Keller, Umesh K. Mishra, and Nicholas A. Fichtenbaum, entitled "METHOD FOR HETEROEPITAXIAL GROWTH OF HIGH-QUALITY N-FACE GaN, InN, and AlN AND THEIR ALLOYS BY METAL ORGANIC CHEMICAL VAPOR DEPOSITION,";

U.S. Provisional Patent Application Ser. No. 60/869,540, filed on Dec. 11, 2006, by Steven P. DenBaars, Mathew C. Schmidt, Kwang Choong Kim, James S. Speck and Shuji Nakamura, entitled "NON-POLAR (M-PLANE) AND SEMI-POLAR EMITTING DEVICES,"; and U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura and James S. Speck, entitled "CRYSTAL GROWTH OF M-PLANE AND SEMIPOLAR PLANES OF (Al, In, Ga, B)N ON VARIOUS SUBSTRATES,";

all of which applications are incorporated by reference herein.

BACKGROUND OF THE INVENTION

1. Field of the Invention

This invention is related to a method for growth of semipolar (Al,In,Ga,B)N optoelectronic devices.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN), and its ternary and quaternary compounds incorporating aluminum and/or indium (AlGaN, InGaN, and AlInGaN), has been well established for fabrication of visible and ultraviolet (UV) optoelectronic devices and high-power electronic devices. These devices are typically grown epitaxially using growth techniques including metalorganic chemical vapor deposition (MOCVD), molecular beam epitaxy (MBE), and hydride vapor phase epitaxy (HVPE).

GaN and its alloys are most stable in the hexagonal würtzite crystal structure, described by two (or three) equivalent basal plane axes that are rotated 120° with respect to each other (the a-axes), all of which are perpendicular to a unique c-axis. Group III atoms and nitrogen atoms occupy alternating c-planes along the crystal's c-axis. The symmetry elements included in the würtzite structure dictate that III-nitrides possess a bulk spontaneous polarization along this c-axis, and the würtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of gallium (Ga) and nitrogen (N) atoms and are charge-neutral. Furthermore, subsequent nonpolar layers are crystallographically equivalent to one another, so the crystal will not be polarized along the growth direction. Two such families of symmetry-equivalent nonpolar planes in GaN are the $\{11\bar{2}0\}$ family, known collectively as a-planes, and the $\{1\bar{1}00\}$ family, known collectively as m-planes. Unfortunately, despite advances made by researchers at the University of California, Santa Barbara, growth of nonpolar nitrides remains challenging and has not yet been widely adopted in the III-nitride industry.

Another approach to reducing, or possibly eliminating, the polarization effects in GaN optoelectronic devices is to grow the devices on semipolar planes of the crystal. The term semipolar planes can be used to refer to a wide variety of planes that possess two nonzero h, k, and thus i, Miller indices, and a nonzero l Miller index. Some commonly observed examples of semipolar planes in c-plane GaN heteroepitaxy include the $\{11\bar{2}2\}$, $\{10\bar{1}1\}$, and $\{10\bar{1}3\}$ planes, which are found in the facets of pits. These planes also happen to be the same planes researchers at the University of California, Santa Barbara, have grown in the form of planar films. Other examples of semipolar planes in the würtzite crystal structure include, but are not limited to, $\{10\bar{1}2\}$, $\{20\bar{2}1\}$, and $\{10\bar{1}4\}$. The nitride crystal's polarization vector lies neither within such planes nor normal to such planes, but rather lies at some angle inclined relative to the plane's surface normal. For example, the $\{11\bar{2}2\}$ and $\{10\bar{1}3\}$ planes are at 58.43° and 32.06° to the c-plane, respectively. The inter-planar angles between a given semipolar plane and the c-plane are listed in Table 1 below.

TABLE 1

Angles of semipolar planes relative to the c-plane

| | Semipolar Plane | | | | | | | | | |
|---|---|---|---|---|---|---|---|---|---|---|
| | 10-12 | 10-14 | 10-13 | 11-24 | 10-12 | 11-23 | 11-22 | 10-11 | 11-21 | 10-1-2 |
| Inclined Angle to c-plane | 18.76° | 25.16° | 32.06° | 39.14° | 43.22° | 47.33° | 58.43° | 61.98° | 72.92° | 74.80° |

In addition to spontaneous polarization, the second form of polarization present in nitrides is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

The advantage of using semipolar planes over c-plane nitrides is that the total polarization will be reduced. There may even be zero polarization for specific alloy compositions on specific planes. Such scenarios are discussed in detail in these scientific papers [4,5]. The important point is that the polarization will be reduced compared to that of c-plane nitride structures.

Semipolar GaN planes have been demonstrated on the sidewalls of patterned c-plane oriented stripes. Nishizuka et al. [1] have grown {11$\bar{2}$2} InGaN quantum wells using this technique. They have also demonstrated that the internal quantum efficiency of the semipolar plane {11$\bar{2}$2} is higher than that of the c-plane, which results from the reduced polarization. Nishizuka et al.'s method involves patterning stripes of a mask material, often $SiO_2$ for GaN. The GaN is grown from open windows between the mask and then grown over the mask. To form a continuous film, the GaN is coalesced by lateral growth. The facets of these stripes can be controlled by the growth parameters. If the growth is stopped before the stripes coalesce, then a small area of semipolar plane can be exposed. The semipolar plane will have a certain degree of inclination to the substrate surface. For example, Nishizuka et al. grew a GaN plane at a 58.43° angle with respect to the c plane, and InGaN quantum wells on top of the GaN plane [2].

Although the Nishizuka method provided high crystal quality semipolar orientation facets, it resulted in the formation of multiple crystal facets, including large areas with a polar {0001} or non-polar {11$\bar{2}$0} orientation. More importantly, the area of the semipolar orientation facet is rather small and non-continuous, and therefore growing and fabricating electrically injected optoelectronic devices on those semipolar orientation facets becomes almost impossible.

Our research group at the University of California, Santa Barbara, has been engaged in an effort to produce planar semi-polar nitride films with a large area of (Al,In,Ga,B)N parallel to the substrate surface, and suitable for use in electrically injected optoelectronic devices. Our research group has successfully grown semipolar InGaN/GaN multiple quantum well (MQW) light emitting diodes (LEDs) via MOCVD using an HVPE-grown 20 µm thick {10$\bar{1}$3} GaN template heteroepitaxially deposited on an m-plane sapphire substrate [3]. Our semipolar LEDs show a limited blue-shift of the electroluminescence peak wavelength with increasing drive current, as compared to c-plane nitride devices, signaling a dramatic reduction of the QCSE. Reduction of the QCSE theoretically leads to a greater internal quantum efficiency; nevertheless, the output power of current semipolar orientation LEDs is rather low, i.e., at a 20 mA driving current, the output power is 120 µW, and the maximum output power is only 250 µW. For comparison, c-plane nitride LEDs have milliwatt (mW) range output power.

The lower semipolar nitride LED output power can be attributed to the high density of non-radiative recombination centers resulting from the rather poor crystal quality. Since the growth of nitride semiconductor is heteroepitaxial, the large difference between the lattice constants of nitride semiconductor layers and the substrate material generates many dislocations, which act as non-radiative recombination centers. In order to achieve better quality crystal growth of semipolar nitride semiconductor layers, further optimization of growth conditions, methodologies, and technology is required.

In summary, growing and fabricating high-quality semipolar orientation electrically injected nitride optoelectronic devices (also referred to as semipolar devices) using current technologies is rather difficult, and it will take a lot of research effort to make those devices comparable in performance to their c-orientation counterparts. The purpose of the present invention described herein is to produce high-quality semipolar devices homoepitaxially, through the use of current sophisticated c-orientation (Al, Ga, In, or B) nitride growth, etching, and epitaxial lateral overgrowth (ELO) techniques.

SUMMARY OF THE INVENTION

The present invention discloses a device comprising one or more oblique or facetted surfaces of a substrate or template. The oblique or facetted surfaces may be formed on a surface of the substrate or template, wherein the substrate or template is c-plane. The oblique or facetted surfaces may be semi-polar planes or non polar planes, for example, {11$\bar{2}$2}, {10$\bar{1}$1}, {10$\bar{1}$3}, {10$\bar{1}$2}, {20$\bar{2}$1}, or {10$\bar{1}$4} planes. The oblique or facetted surfaces may be etched oblique or facetted surfaces of the substrate or template, the oblique or facetted surfaces may be sidewalls or facets of trenches, grooves, or pits in a surface of the template or substrate. The trenches, grooves, or pits may have a maximum depth not greater than 10 microns and a spacing in a range between 3 and 10 microns. Alternatively, the oblique or facetted surfaces are surfaces of epitaxial lateral overgrowths of the substrate or template.

One or more active layers may be formed epitaxially on the oblique or facetted surfaces or on one or more epitaxial layers formed on the oblique or facetted surfaces. The active layers or epitaxial layers may be formed homoepitaxially or by regrowth on the one or more oblique surfaces. The device may comprise a n-type nitride layer, a p-type nitride layer, with the active layers between the n-type nitride layer and the p-type nitride layer, wherein the active layers are light emitting and nitride based. Or, the device may comprise an n-type waveguide layer, a p-type waveguide layer, the active layers between the n type waveguide layer and the p-type wave guide layer, wherein the active layers are light emitting, one or more n-type nitride layers above or below the n-type waveguide layer, and one or more p-type nitride layers above or below the n-type waveguide layers.

At least one of the active layers, substrate, template, or epitaxial layers may comprise (Al, Ga, In)N-based material. The active layers may comprise multi quantum well (MQW) layers comprising indium. One or more p-type layers may be formed on the oblique surfaces above or below the active layers, or the epitaxial layers or template may comprise n-type or p-type material.

The present invention also discloses a method for fabricating a semiconductor device having one or more crystallographic orientations, comprising forming one or more oblique surfaces or inclined facets of a substrate or template. The oblique surfaces or inclined facets may be formed with a semipolar or nonpolar orientation.

The template may comprise (Al,Ga,In,B)N material, or the substrate may comprise bulk aluminium nitride or gallium nitride, or both the substrate and template may comprise (Al,Ga,In,B)N material. The template or substrate may be c-plane. The template may comprise at least one of the following: one or more laterally epitaxially overgrown layers for defect reduction, one or more n-doped or p-doped layers of a device, or one or more layers with varying refractive index to form a distributed Bragg reflector.

The forming step may comprise etching the template or substrate. The etching may be dry etching, wherein a greater inclination for the oblique surfaces is achieved by a greater degree of chemical etching and a lesser degree of physical etching. The etching may comprise etching one or more areas of a surface of the substrate or template to form pits, trenches or grooves having sidewalls which are the oblique surfaces or inclined facets.

The etching may comprise etching one or more areas of a surface of the substrate or template to a maximum depth in a range between 1 nanometer and 10 microns which determines a surface area of the oblique surfaces, wherein a width of the areas is in a range between 3 and 10 microns and determines an angle of inclination of the oblique surfaces or inclined surfaces.

The etching may further comprise masking areas on the substrate or template to create masked and unmasked areas, and etching the unmasked areas, wherein the masked regions are etched at a relatively slower rate than the unmasked areas. The masked and unmasked regions may be formed using nanoimprinting. The masked areas may be stripes having a spacing that determines an inclination angle of the oblique surfaces, wherein the spacing may range between 3 and 10 microns.

The forming may further comprise performing an epitaxial lateral overgrowth of the substrate or template and terminating the epitaxial lateral overgrowth before adjacent overgrowth stripes coalesce, wherein one or more surfaces of the epitaxial overgrowth comprise the oblique surfaces or inclined facets.

The oblique surfaces or inclined facets may not all have a same orientation. The oblique surfaces or inclined facets may be formed with an inclination angle in the range 25 to 50 degrees.

The method may further comprise annealing the oblique surfaces after the oblique surfaces are formed, to create crystallographic facets with semipolar orientation.

The method may further comprise depositing one or more epitaxial layers on the one or more oblique surfaces. The oblique surfaces may be formed with an inclination angle larger than is desired because the depositing step reduces the inclination angle to the desired inclination angle. Metalorganic chemical vapor deposition, molecular beam epitaxy, sublimation, vapor phase epitaxy, or ammonothermal growth may be used to deposit the epitaxial layers.

According to the method of the present invention, at least the first epitaxial layer may be regrown or homoepitaxially deposited. The epitaxial layers may comprise at least one of the following: an n-type layer, p-type layer, light emitting layer, active layer, or (Al,In,Ga,B)N layer.

The depositing step may further comprises regrowing an n-type nitride layer on the oblique surfaces using metalorganic chemical vapor deposition (MOCVD), at a raised wafer temperature of approximately 1050° C., under a flow of hydrogen, nitrogen and ammonia, lowering the wafer temperature to approximately 800° C. and depositing one or more light emitting (In,Ga)N layers on the regrown n-type nitride layer, and depositing one or more further device layers on the light emitting (In,Ga)N layers.

The depositing step may result in a final surface which is substantially planar. The method of the present invention may be used to fabricate a substrate or a device, for example a substrate, light emitting diode, a laser diode, a photovoltaic cell, a high electron mobility transistor, or a device which would benefit from a reduction in internal polarization fields or increased hole mobility.

BRIEF DESCRIPTION OF THE DRAWINGS

Referring now to the drawings in which like reference numbers represent corresponding parts throughout:

FIG. 2 shows schematically a cross-section of a sample before a facetted surface has been processed.

DETAILED DESCRIPTION OF THE INVENTION

Figure 1:
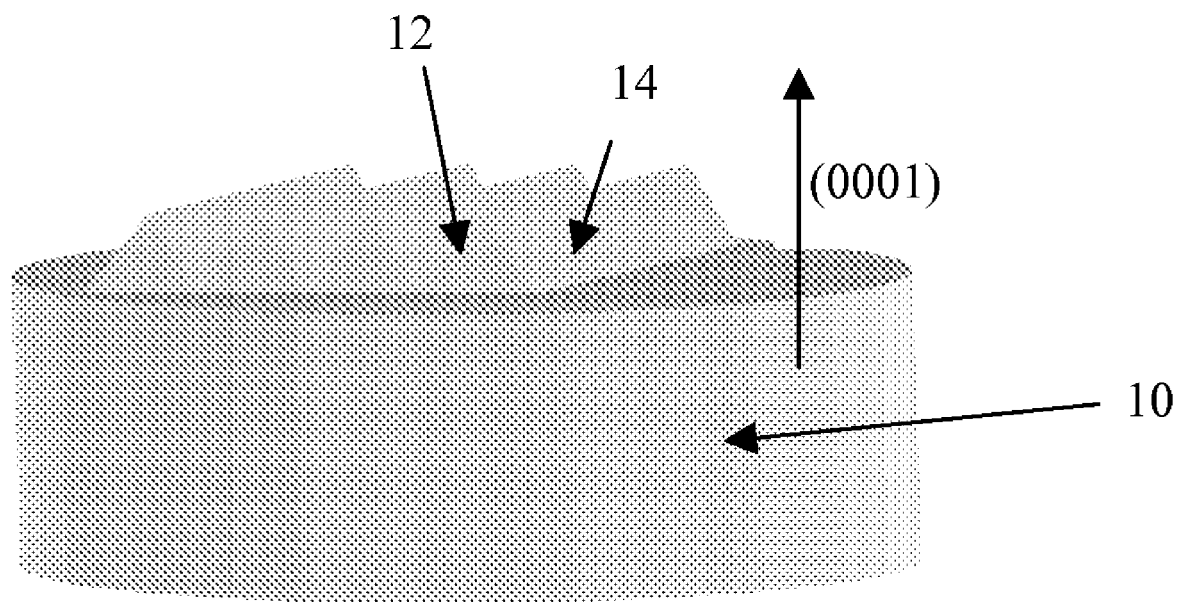
FIG. 1 is a three-dimensional schematic of a representative faceted surface for device regrowth after surface texturing has been performed.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a novel method for growing high-efficiency (Al,In,Ga)N based optoelectronic devices wherein one or more layers of the device structure, including but not limited to the active region(s), may be described as having a semipolar orientation. The method utilizes device-quality nitride semiconductor thin film template layers, including, but not limited to c-plane GaN, grown on a c- or a-plane sapphire substrate. These layers, and subsequent device layers may be grown via techniques, including but not limited to MOCVD, MBE or HVPE. The use of different etching techniques creates semipolar oriented facets on c-plane GaN films for device structure re-growth. This in turn maintains the inherent advantages of semipolar nitride orientations, such as reduced polarization-induced internal electric fields and higher p-type doping efficiency, while improving device layer properties, such as greatly reduced defect density, and the ability to use common growth parameters at the cost of a small increase in surface roughness compared to traditional planar semipolar films. These properties are desirable for semiconductor devices made from semipolar nitride layers.

In addition, the use of etching to create semipolar (Al,In,Ga)N planes on (Al,In,Ga)N templates (including, but not limited c-plane GaN) enables one to choose any semipolar GaN plane for device growth without regard to the substrate material, since by changing the etching conditions, one can create GaN facets with varying inclination angles, corresponding to the desired semipolar orientation.

Lateral epitaxial overgrowth is another approach to the formation of semipolar a selective masking material, such as silicon dioxide ($SiO_2$) or silicon nitride (SiN), on a c-plane sapphire substrate, silicon carbide (SiC) substrate, or (Al,In,Ga)N template, one can grow semipolar facets using suitable growth conditions. [1,2]

Technical Description

This invention describes a method for producing high-quality (i.e., low defect density and high internal quantum efficiency) light-emitting devices. As mentioned above, a semipolar orientation plane has an inclined angle with respect to the c-plane. This invention employs certain techniques, such as etching or ELO, to create facets with identical inclination angle corresponding to the desired semipolar plane on a c-plane GaN template for subsequent device regrowth. Then, devices grown on such facets should be semipolar oriented and thus posses all the advantages of semipolar orientation devices, such as high internal quantum efficiency. Moreover, the defect density of such devices should be low due to homoepitaxial growth.

The epitaxial layers are typically deposited on a {0001} sapphire substrate. However, other substrate materials or crystal orientations may also be used to achieve these results. The epitaxial growth described herein is carried out by the technique of MOCVD. Other epitaxial growth techniques, such as MBE, may also be used to achieve the same objectives. A dry etching technique or ELO technique is used to produce the desired surface texture prior to the re-growth of the light-emitting layer. Nevertheless, other techniques may also be used to produce the same surface texture. A specific texture pattern and depth are described in more detail below. However, a range of values for these parameters may be used.

FIG. 1 shows a three-dimensional schematic of a representative facetted or oblique surface for device growth or regrowth after surface texturing has been performed, comprising the c-plane (0001) n-type GaN template layer (or c-plane (0001) sapphire substrate) 10, and semipolar orientation GaN facets labeled as 12 and 14. The facets 12, 14 may, for example, comprise the sidewalls of trenches, grooves or pits in the substrate 10. Those semipolar orientation faceted stripes can be formed along any directions that are suitable for the regrowth on the template or substrate. Dry etching or ELO can be used to form those facets.

Figure 2:
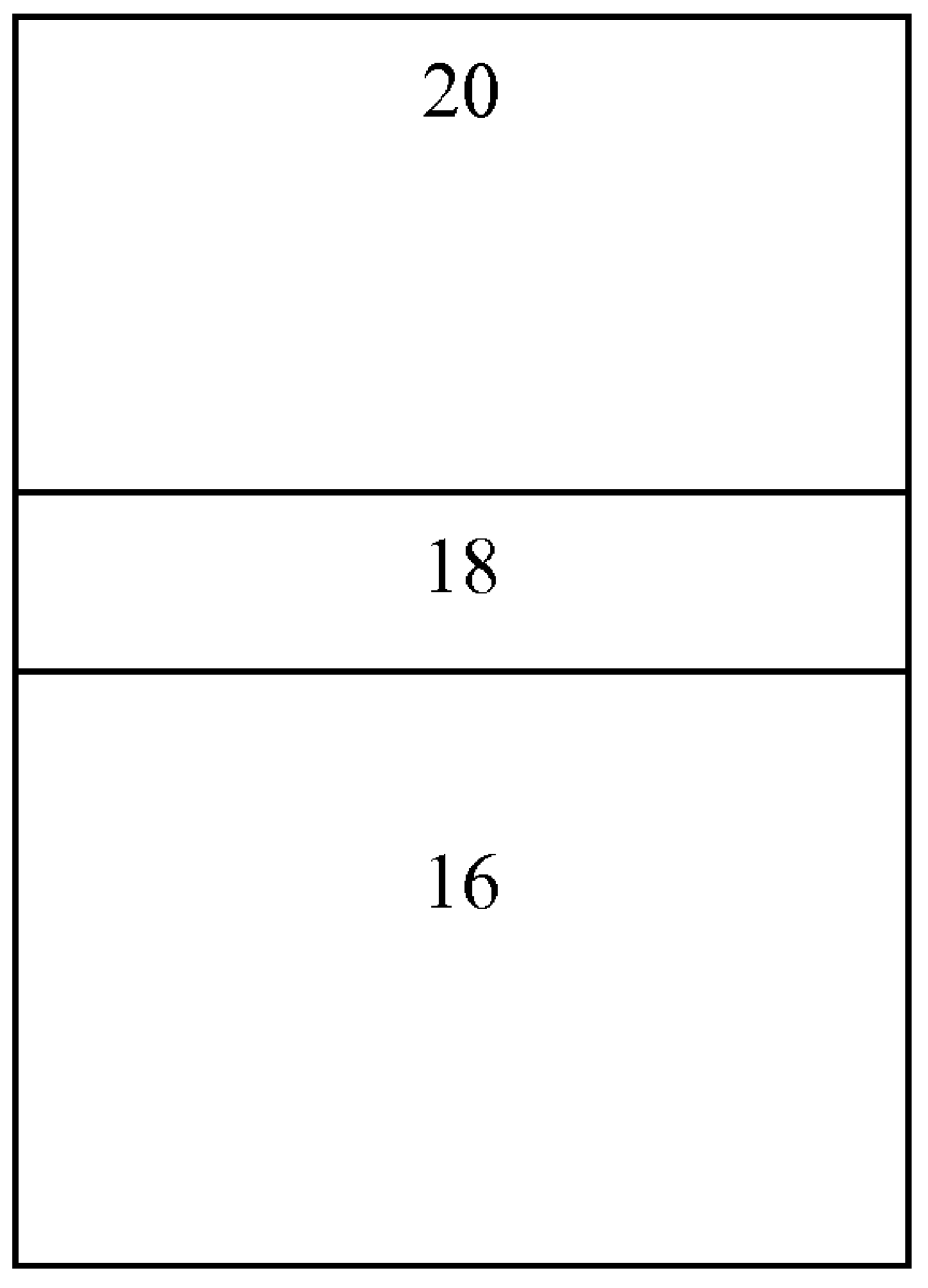
Figure 3:
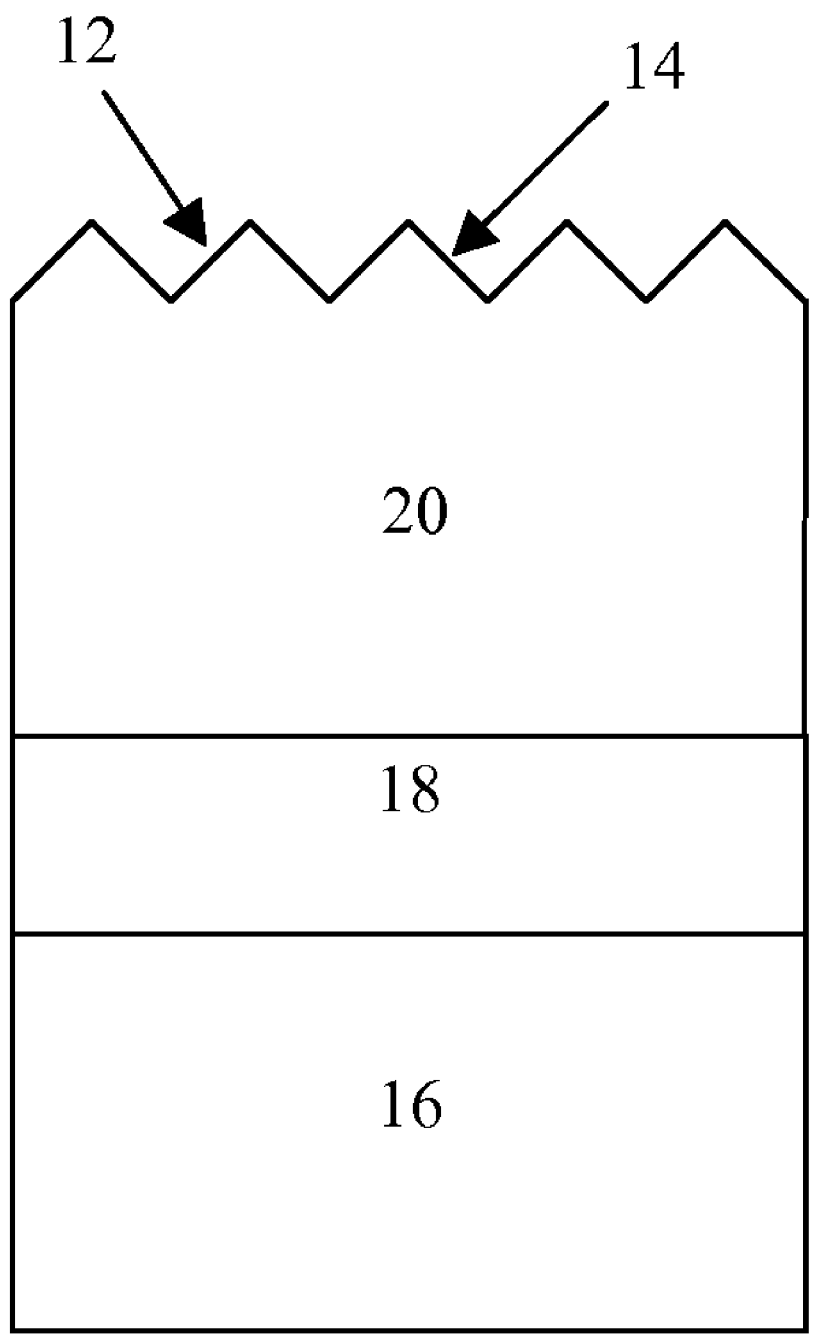
FIG. 3 shows schematically a cross-section of a sample after facet processing by etching the surface of FIG. 2.
Figure 4:
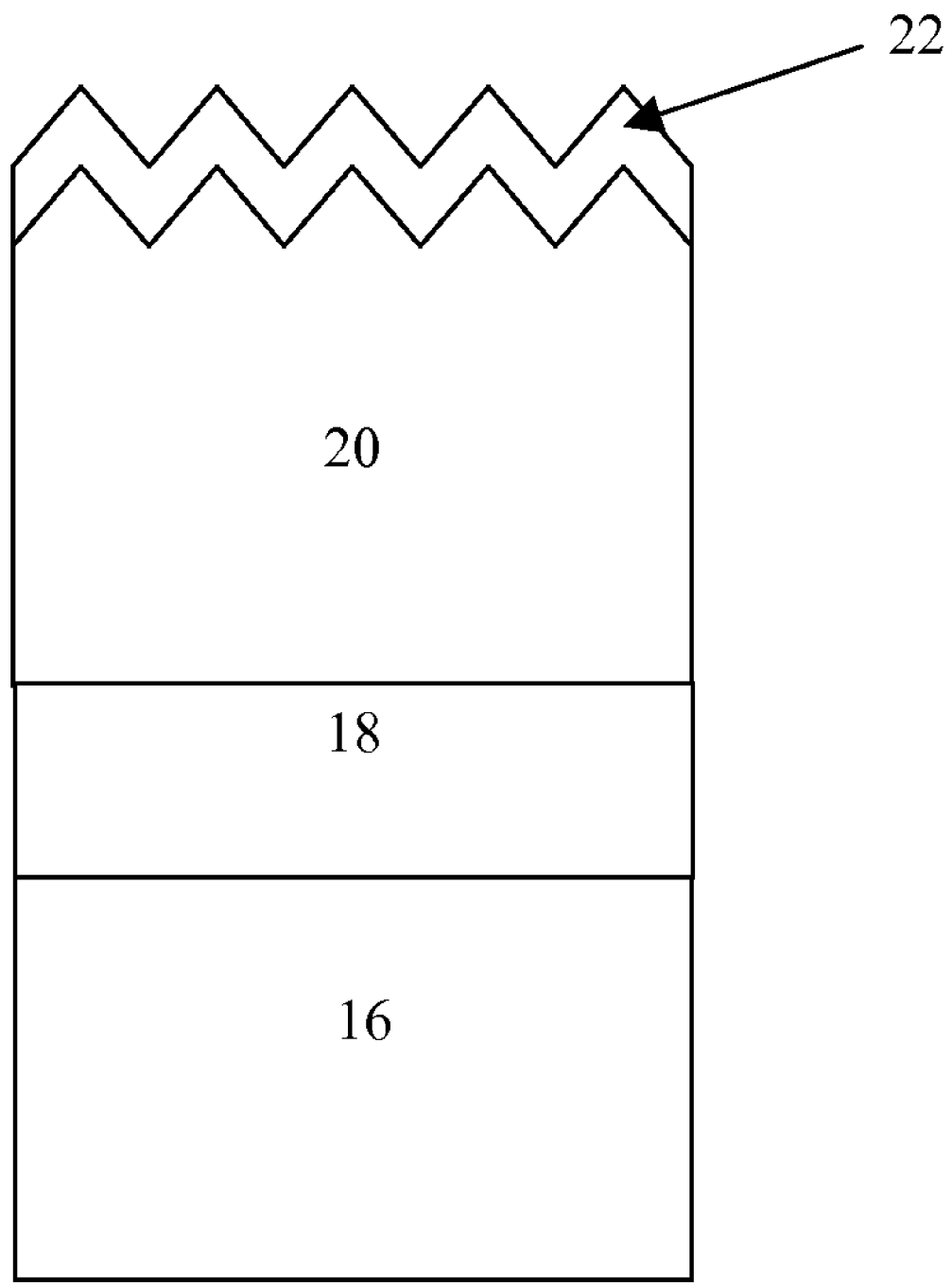
FIG. 4 shows schematically a cross-section of a sample after deposition of an epitaxial layer on the facetted surface of FIG. 3.

FIGS. 2 and 3 show schematically the sequence of steps involved in producing the result described in FIG. 1, using a dry etching technique. FIG. 2 shows a sapphire substrate 16, a GaN template layer 18, and n-type GaN layer 20. FIG. 3 shows a sapphire substrate 16, GaN layer 18, n-type GaN layer 20 and semipolar orientation facets, oblique surfaces or inclined facets 12, 14 formed on the GaN layer 20 by dry etching. FIG. 4 shows schematically a cross-section of a sample after deposition of an epitaxial layer 22 on the facetted surface of FIG. 3.

Figure 5:
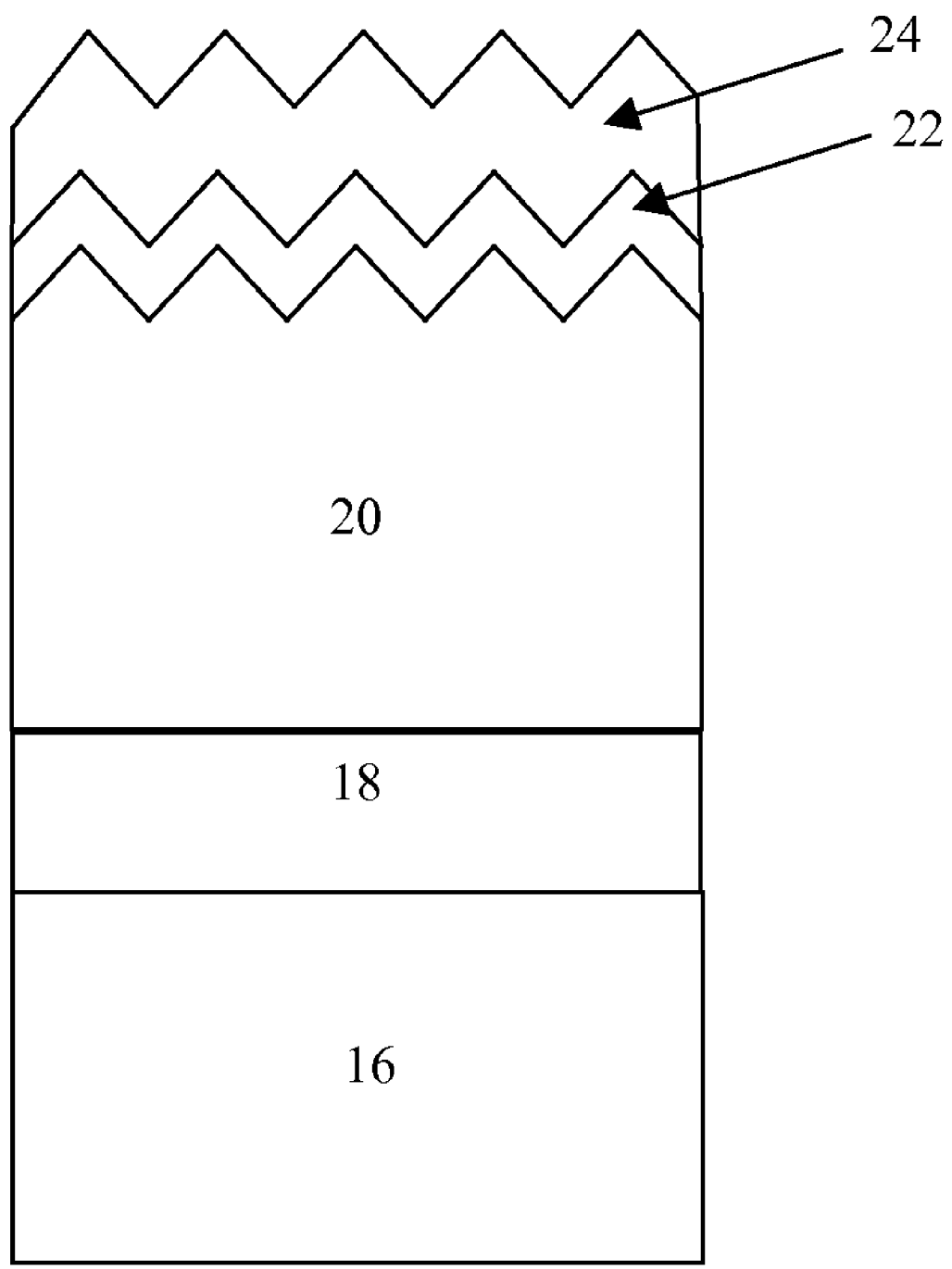
FIG. 5 shows schematically a cross-section of a sample after a facetted surface has been formed by etching, after a first regrowth on top of the facets, and after a second regrowth on top of the first regrowth.
Figure 6:
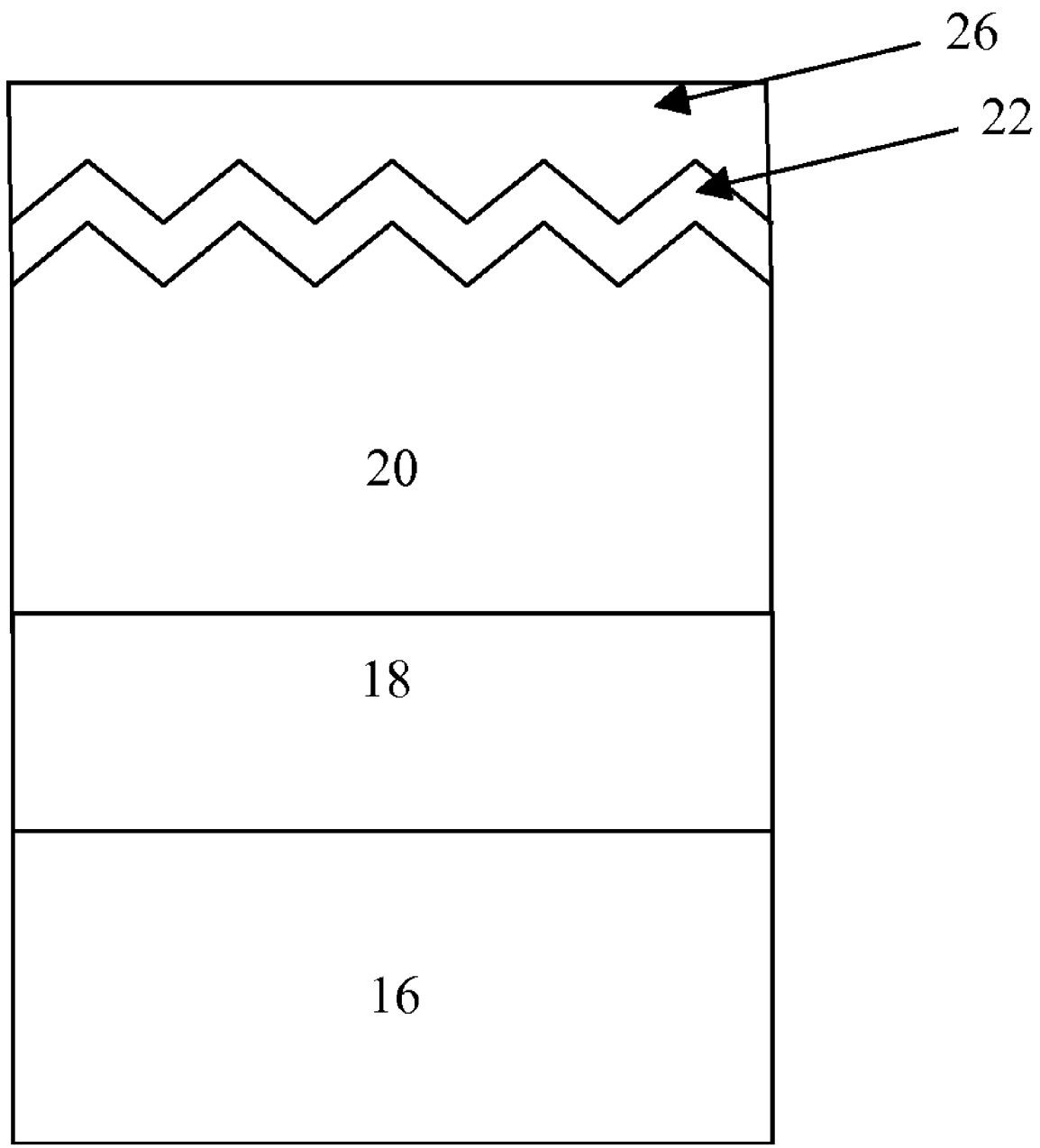
FIG. 6 shows a cross-section of the sample after a facetted surface has been formed by etching, after a first regrowth on top of the facets, and after a second regrowth on top of the first regrowth to form a planar surface.

FIGS. 5 and 6 show cross-sections of the sample after device regrowth using MOCVD. FIG. 5 shows a sapphire substrate 16, GaN template layer 18, n-type GaN layer 20, light emitting layer (or active layers) 22 grown on those semipolar orientation facets, and possible facetted surface after regrowth 24. FIG. 6 shows a sapphire substrate 16, GaN template layer 18, n-type GaN layer 20, light emitting layer 22 grown on those semipolar orientation facets, and possible planar surface after regrowth 26.

Figure 7:
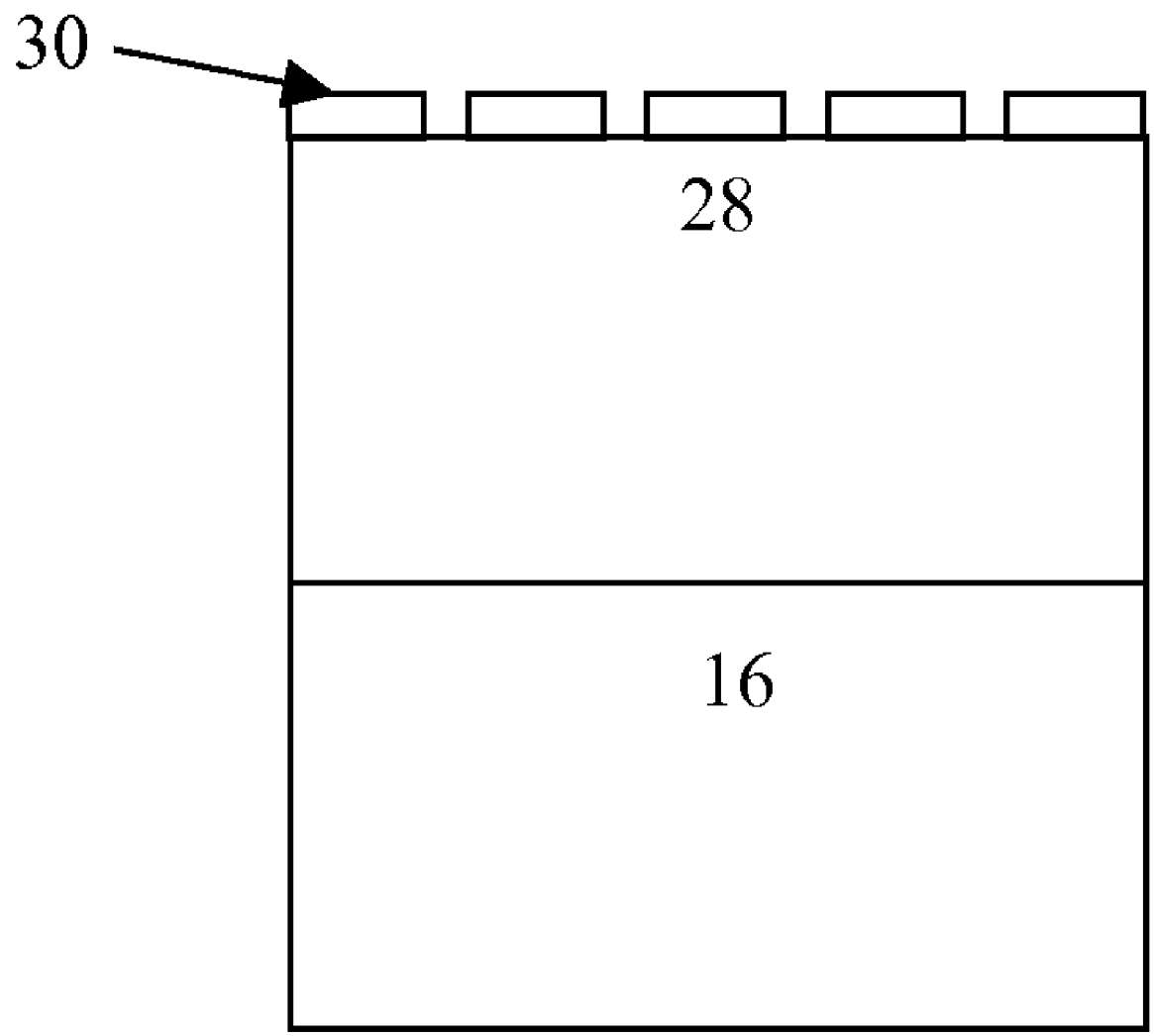
FIG. 7 shows the structure before processing to form a facetted surface, but with a patterned mask for performing ELO.
Figure 8:
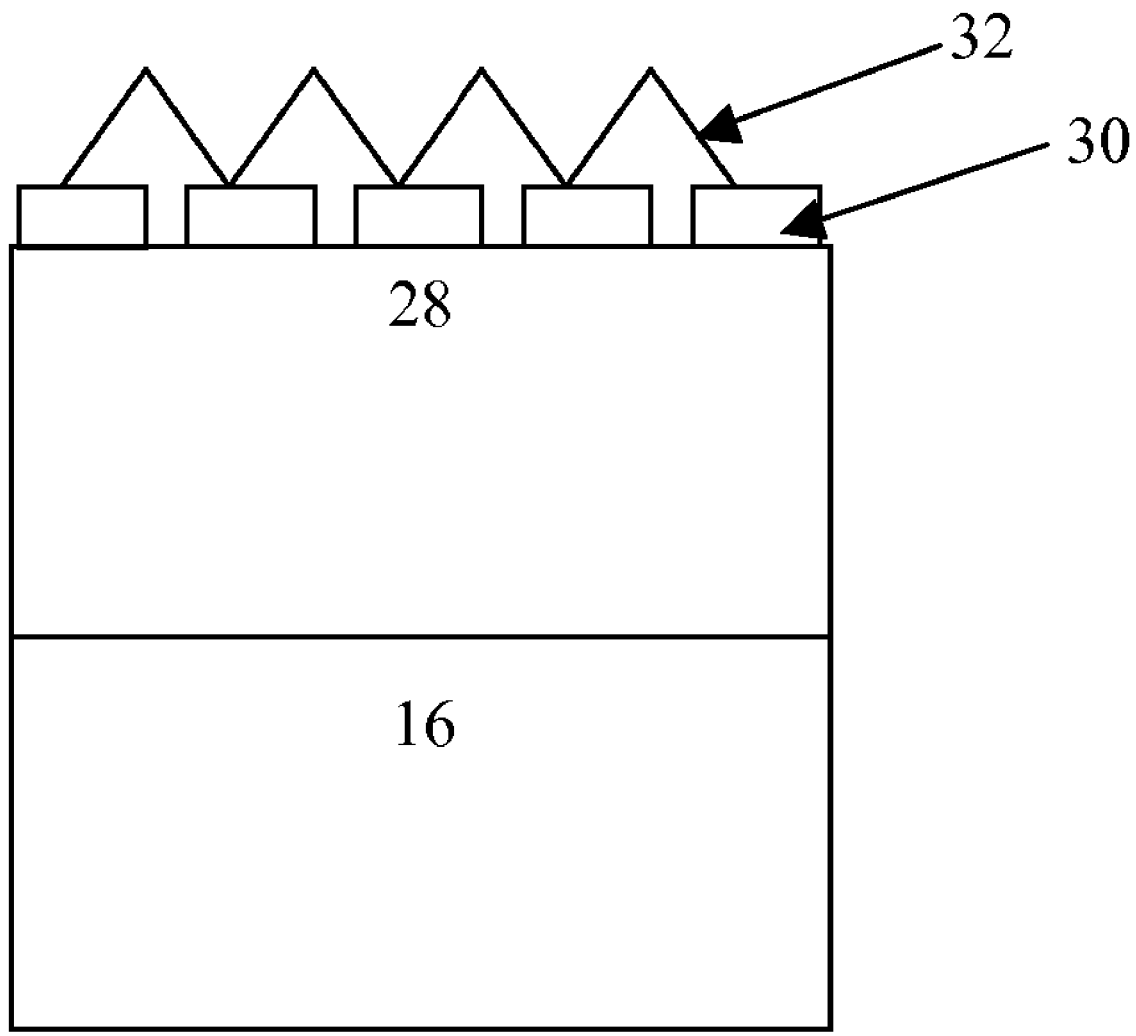
FIG. 8 shows the structure after ELO regrowth on the surface of FIG. 7.

FIGS. 7 and 8 show schematically the sequence of steps involved in producing the result described in FIG. 1, using an ELO technique. FIG. 7 shows a sapphire substrate 16, GaN template layer 28, and patterned $SiO_2$ or SiN stripes 30 (those stripes may also be patterned directly on the c-plane sapphire substrate). FIG. 8 shows a sapphire substrate 16, GaN layer 28, patterned $SiO_2$ or SiN stripes 30, and facets 32 formed after ELO regrowth using MOCVD. HVPE and MBE can also be used to perform such ELO regrowth.

Figure 9:
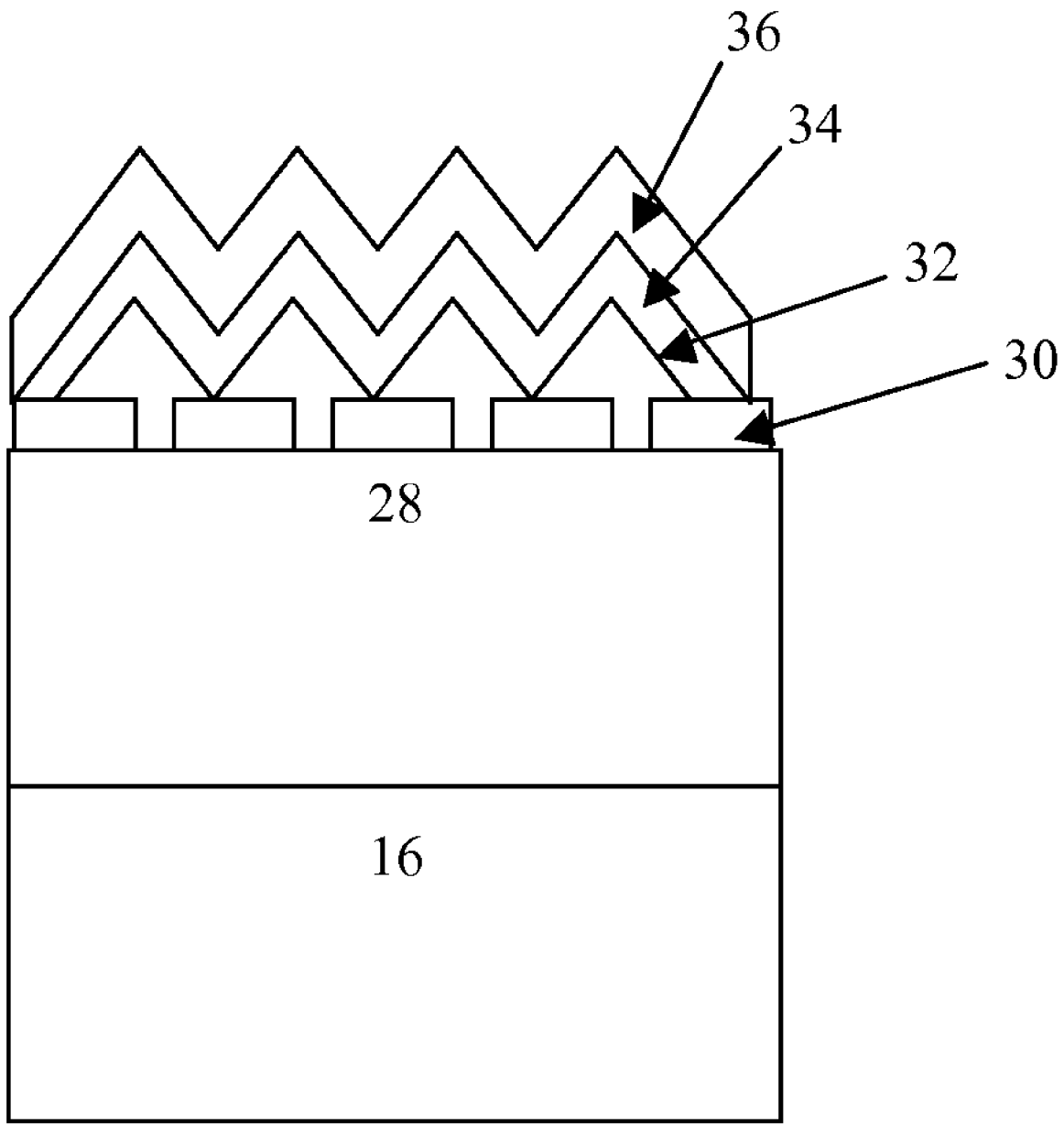
FIG. 9 shows a cross-section of the sample after semi-polar orientation facets have been formed by ELO, after a first regrowth on top of the facets, and after a second regrowth layer on top of the light emitting layer.
Figure 10:
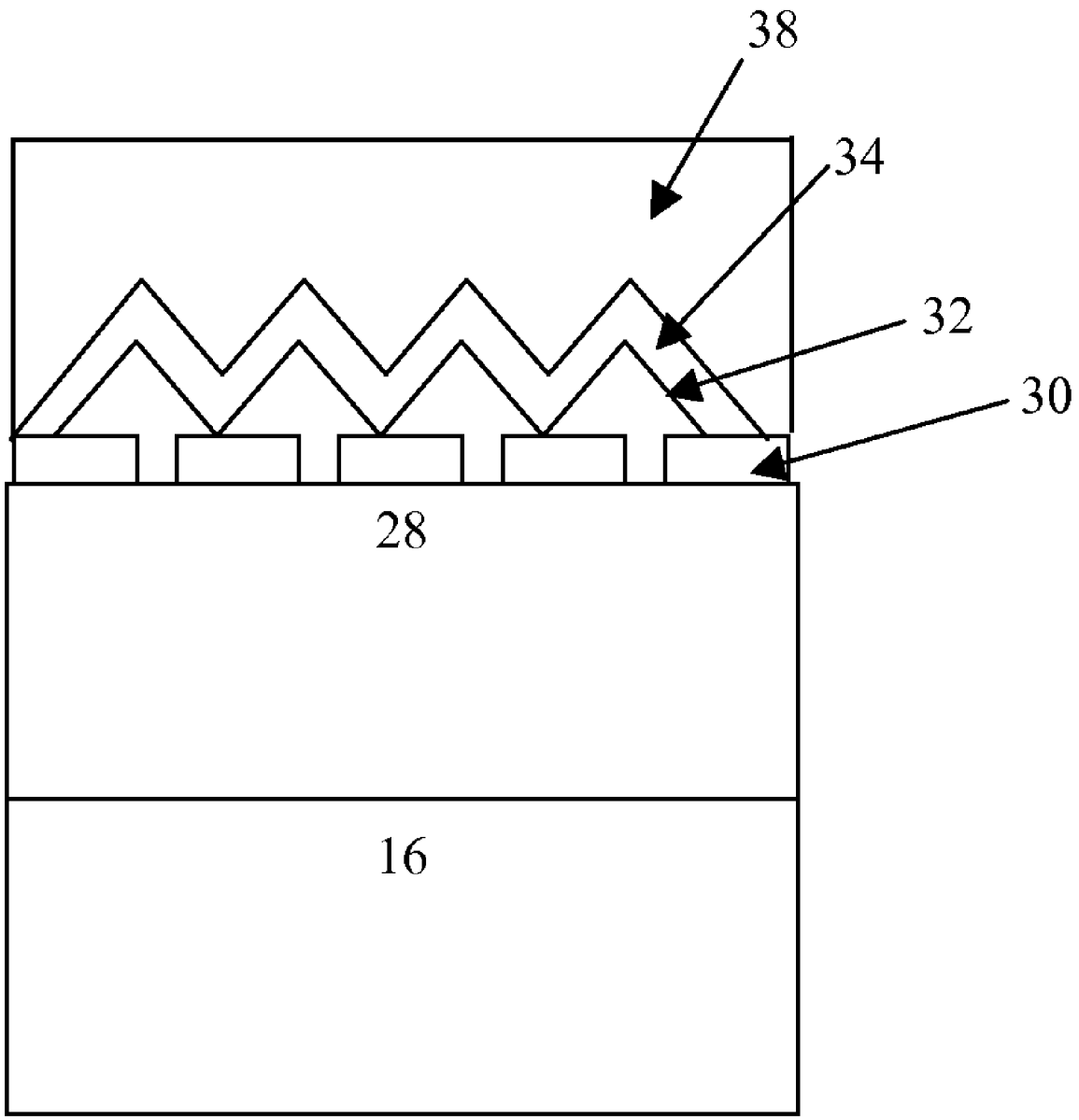
FIG. 10 shows a cross-section of a sample after semi-polar orientation facets have been formed by ELO, after a first regrowth on top of the facets, and after a second regrowth layer on top of the light emitting layer to form a planar surface.

FIGS. 9 and 10 show cross-sections of the sample after device regrowth using MOCVD. FIG. 9 shows a sapphire substrate 16, GaN layer 28, patterned $SiO_2$ or SiN stripes 30, facets 32 formed by ELO, light emitting layer 34 grown on those semipolar orientation facets 32, and possible facetted surface after regrowth 36. FIG. 10 shows a sapphire substrate 16, GaN layer 28, patterned $SiO_2$ or SiN stripes 30, facets 32 formed by ELO, light emitting layer grown on those semipolar orientation facets 34, and possible planar surface after regrowth 38.

Thus, FIGS. 1-10 illustrate examples of a device comprising one or more oblique or facetted surfaces 12, 14, 32 of a substrate 10 or template 18, 20 (the template may comprise additional layers 18, for example, n-type or p-type layers), and one or more active layers 22, 34 formed epitaxially on the oblique or facetted surfaces 12, 14, 32. Additional epitaxial layers may be formed between the oblique surfaces 12, 14 and the active layers 22, 34. Examples of the epitaxial layers or active layers include, but are not limited to, homoepitaxial layers, growths, regrowths, heteroepitaxial layers, n-type or p-type material, or (Al,Ga,In,B)N based layers. Further epitaxial layers, for example, (Al, Ga, In, B)N layers, n or p type layers, may be formed above the active layers. The oblique or facetted surfaces on the substrate or template therefore serve as a substrate for subsequent deposition of epitaxial layers.

The importance of this invention is that, by growing nitride based light emitting layers on those semipolar orientation facets, the crystallographic direction of such layers is semipolar, and moreover, the growth of such layers is homoepitaxial, and thus, the light emitting layers should have a fairly low defect density.

Specific Process Steps

Figure 11:
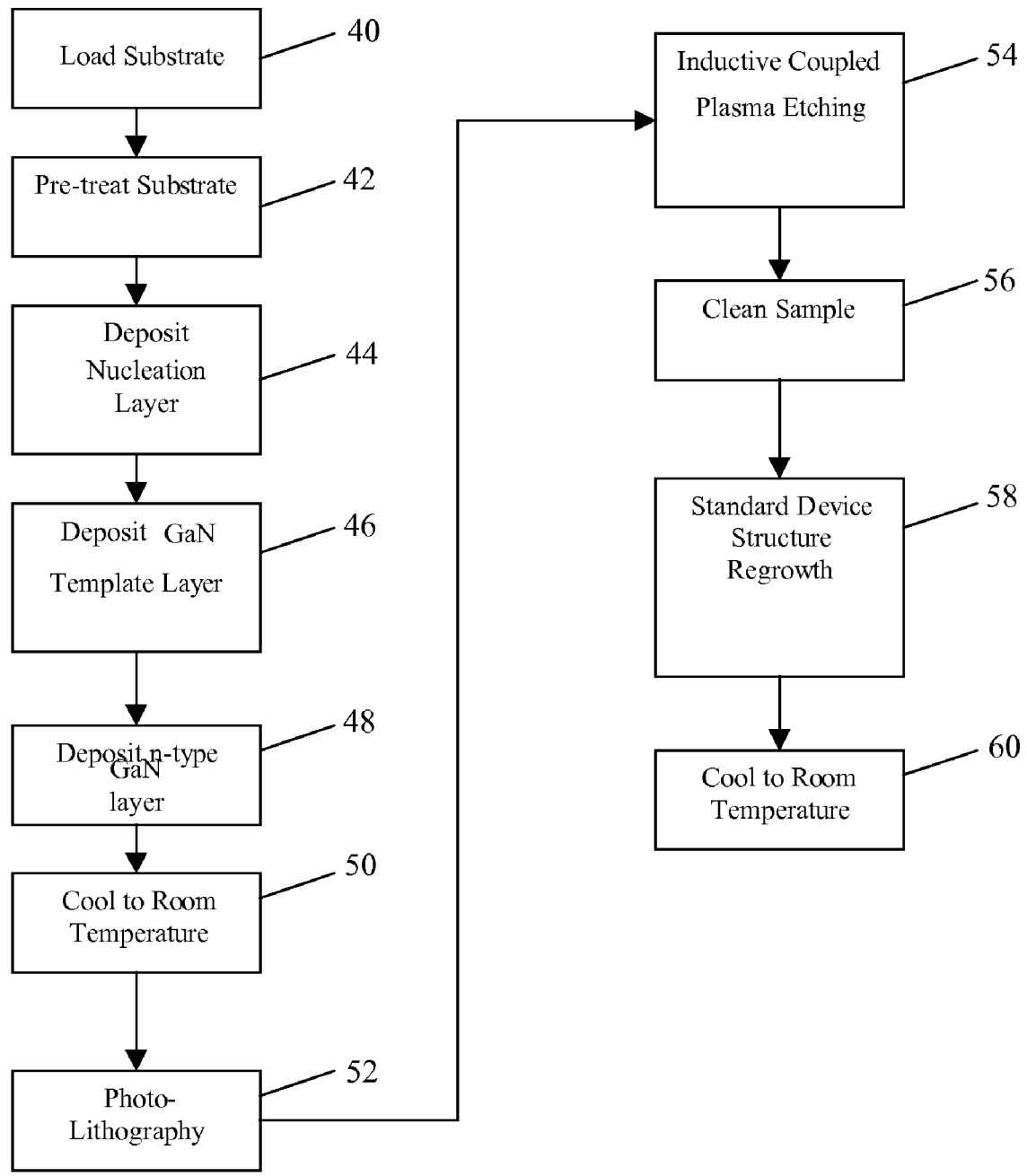
FIG. 11 is a flowchart illustrating a typical growth and fabrication sequence, involving dry etching, that yields a device.

FIG. 11 is a flowchart illustrating a typical growth and fabrication sequence involving dry etching technique that yields the light-emitting device according to the preferred embodiment of the present invention. It should be noted that temperatures, gas flow rates and step times are specific to the reactor used, and if and where provided, are only meant to serve as a reference. Other temperatures, gas flow rates and step times may be used without departing from the scope of the present invention.

1. In Block 40, a c-plane sapphire substrate is loaded into the MOCVD reactor through an antechamber that is evacuated and backfilled with nitrogen gas in order to prevent oxygen from entering the reactor chamber.

2. In Block 42, a mixture of hydrogen ($H_2$) and nitrogen ($N_2$) gas is flowed through the reactor chamber, and the heater temperature is raised to an estimated wafer surface temperature of ~1075° C. (measured thermocouple temperature of 925° C.), where it is held for a duration of roughly 10 minutes, in order to "pre-treat" the sapphire substrate.

3. In Block 44, the temperature is lowered to an estimated wafer surface temperature of ~570° C. (measured thermocouple temperature of 470° C.), and ammonia ($NH_3$) gas is introduced into the reactor chamber, in addition to hydrogen and nitrogen gases. Once the temperature is stable, a small flow of tri-methyl gallium (TMG) is injected into the reactor chamber, and a thin, mostly amorphous, "nucleation" layer of GaN is deposited on the substrate.

4. In Block 46, the TMG flow is stopped, and the temperature is raised at a controlled rate to an estimated wafer surface temperature of ~1050° C. (measured thermocouple temperature of 900° C.). Once the temperature stabilizes, the flow of TMG is resumed. The growth of a GaN:UID (unintentionally doped) template layer thus begins, and is continued until approximately 2-10 µm of GaN has been deposited onto the substrate.

5. At this point, in Block 48, a small flow of silane gas ($SiH_4$) is introduced into the gas stream injected into the reactor, to obtain n-type conductive GaN. The growth is continued until a 1 micron thick n-type conductive GaN layer is deposited on the template layer.

6. In Block 50, the flow of TMG and $SiH_4$ is terminated to stop the deposition, and the temperature is lowered to room temperature. The flow of $NH_3$ is continued during the cool-down, in order to prevent degradation of the deposited GaN film. The sample is then removed from the reactor.

7. In Block 52, a suitable photoresist is spun onto the sample after appropriate surface preparation, and the desired pattern is then transferred onto the photoresist using a suitable photolithography tool, and using a mask designed for this specific purpose. Different masks may be designed for different facet inclination angles. Inclined angles ranging from 25° to 50° are preferred in this embodiment.

One important factor that should be considered in the mask design is the desired etching depth (the height of the facets), which determines the area of the facets, i.e., the greater the height, the larger the area of the facets. It is always desired to increase the facet area as much as possible; on the other hand, increasing the area of facets requires a greater etching depth, which leads to a rougher surface. In the preferred embodiment of this invention, a 2 µm etch depth has been chosen as a result of series of experiments. Nevertheless, etching depth ranging from 1 nanometer to 10 micron should also be considered.

Figure 12:
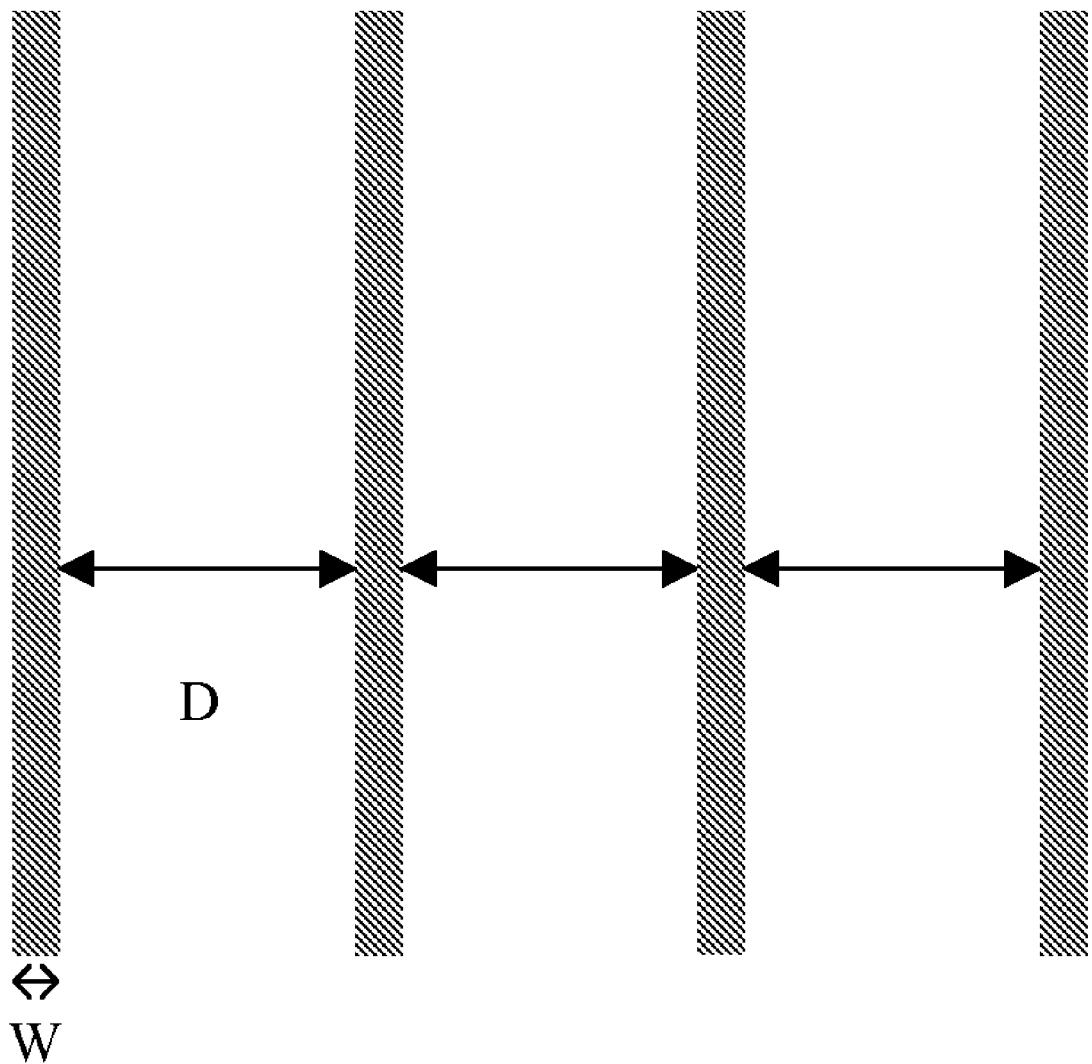
FIG. 12 is a schematic of a mask pattern that can be used to control the etch to form the facetted surface.

With the etching depth chosen, details of the mask are determined. See FIG. 12 and Table 2, where W is the width of each chromed stripe, and D is the spacing (no chrome) between each stripe.

TABLE 2

| Mask dimensions for different semipolar planes | | | | | |
|---|---|---|---|---|---|
| | Semipolar plane | | | | |
| | 10-14 | 10-13 | 11-24 | 10-12 | 11-23 |
| W (µm) | 1 | 1 | 1 | 1 | 1 |
| D (µm) | 8.51 | 6.4 | 5 | 4.25 | 3.68 |

A suitable developer is then used to develop the photoresist, and this is followed by a hard-bake. The sample is then "de-scummed" using an oxygen plasma.

8. In Block 54, the sample is introduced into the Inductive Coupled Plasma (ICP) tool for dry etching. Dry etching involves two types of etching mechanisms: a chemical etch and a physical etch. The chemical etch is controlled by the flow-rates of different chemically active gases, such as chlorine, $BCl_3$, etc., into the etching chamber, and the etching chamber pressure. The physical etch depends on the flow-rates of chemically inert gases, such as noble gases or nitrogen gas, into the etching chamber, the ICP power, which controls the density of the plasma, as well as the bias power, which controls the power of the plasma bombarding the sample.

As a general guideline, inclined sidewalls may be obtained from a greater degree of chemical etching and a lesser degree of physical etching. In other words, a higher concentration of chemically active gases, higher chamber pressures, a lower concentration of chemically inert gases, as well as lower ICP and bias powers result in a greater inclined sidewall. Etch parameters for different inclination angle may be chosen according to this guideline.

The area of the deposited GaN layers that is not protected by the photoresist mask is etched under certain conditions to create the textured surface, i.e., the inclined facets. In areas protected by photoresist, the photoresist is etched at a relatively slower rate. The etch is carried out for a suitable duration so as to obtain an etch depth of roughly 2 µm into the GaN film. Previously established etch rates as well as etching selectivity between photoresist and GaN film are used to determine this duration.

Thus, blocks 52-54 illustrate an example of forming one or more oblique surfaces or inclined facets of a substrate or template, by masking the surface of a substrate or template and etching unmasked areas of the surface.

9. In Block 56, the sample is removed from the ICP tool, and suitable solvents are used to remove the remaining photoresist. A profilometer is used to confirm that the etch profile of the GaN film obtained is as desired. The sample is then cleaned using solvents and prepared for re-introduction into the MOCVD reactor.

10. In Block 58, the sample is re-introduced into the MOCVD reactor for device structure regrowth. The temperature is raised to the estimated wafer surface temperature of ~1050° C., while a mixture consisting of $NH_3$, $N_2$ and $H_2$ gases is flowed. When the temperature stabilizes, appropriate volumes of TMG and $SiH_4$ are introduced into the gas stream, and roughly 100 nm of an n-type conductive GaN layer is re-grown on the semipolar orientation facetted surface. The flow of TMG, $SiH_4$ and $H_2$ is stopped, and the temperature is lowered to an estimated wafer surface temperature of ~800° C. (measured thermocouple temperature of 675° C.). The indium-containing light-emitting layer is deposited on the re-grown n-type conductive GaN layer at this temperature. A 3 nm-thick quantum well (QW) layer of (In,Ga)N is deposited on the re-grown n-type conductive semipolar GaN layer. Suitable flows of tri-ethyl gallium (TEG) and tri-methyl indium (TMI) are flowed during the deposition of the (In,Ga)N well layer, while only TEG is flowed during the deposition of the GaN layer. The rest of the device structure is grown on top of the semipolar orientation light emitting layer using standard growth parameters.

The growth parameters vary depending on the individual semipolar orientation facets on which the device, i.e., light emitting diode (see FIG. 17), or laser diode (see FIG. 18), is grown.

Thus, block 58 illustrates an example of the step of depositing one or more epitaxial layers on the oblique surfaces or inclined facets.

11. In Block 60, the flow of all the gases into the chamber, except $NH_3$, is terminated to stop the deposition, and the temperature is lowered to room temperature. The flow of $NH_3$ is continued during the cool-down, in order to prevent degradation of the deposited GaN film. The sample is then removed from the reactor.

Figure 13:
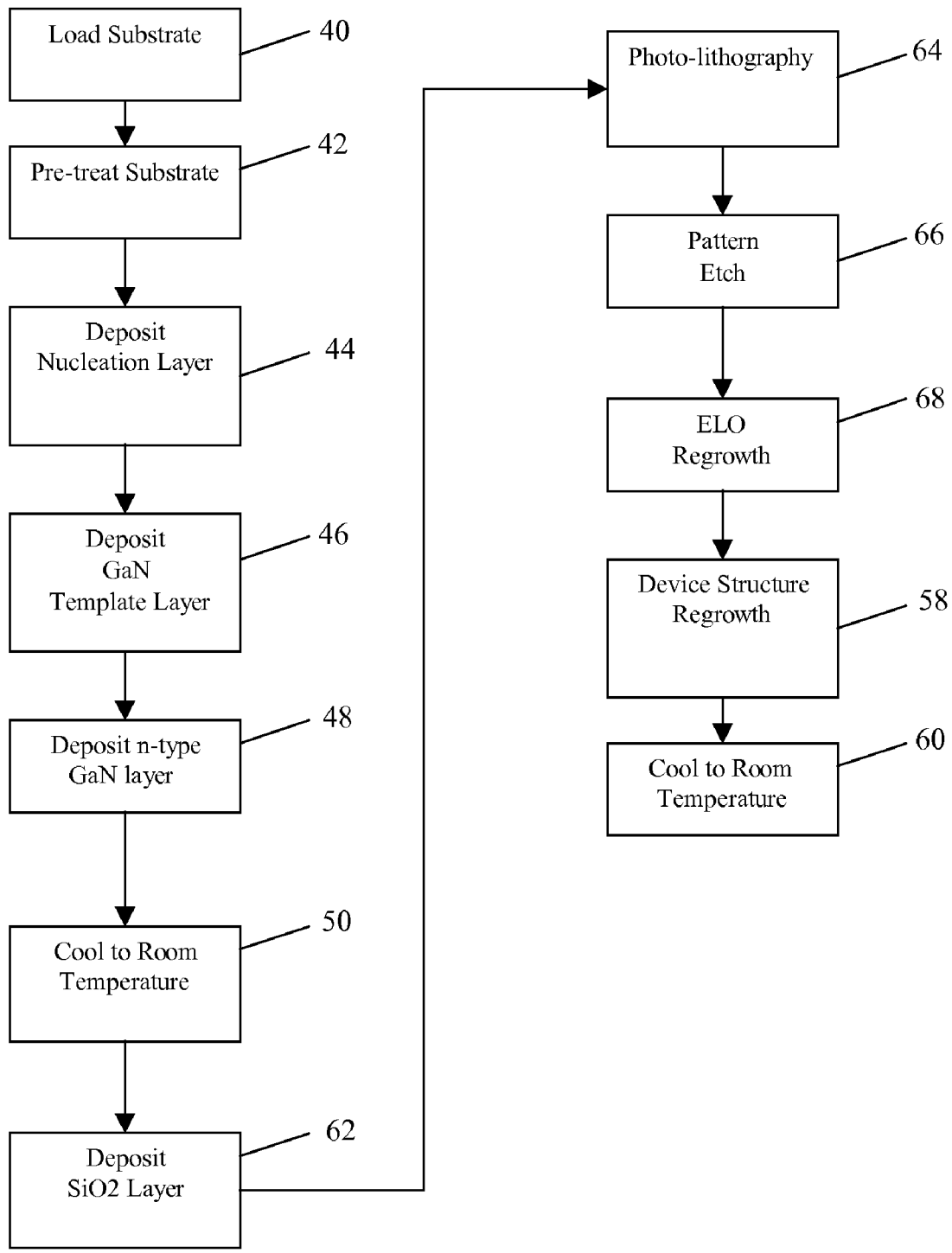
FIG. 13 is a flowchart illustrating a typical growth and fabrication sequence involving ELO technique that yields a device.

FIG. 13 is a flowchart illustrating a typical growth and fabrication sequence involving an ELO technique that yields the light-emitting device according to the preferred embodiment of the present invention. It should be noted that temperatures, gas flow rates and step times are specific to the reactor used, and if and where provided, are only meant to serve as a reference. Other temperatures, gas flow rates and step times may be used without departing from the scope of the present invention.

Blocks 40-50 are identical in both FIG. 11 and FIG. 13.

In Block 62, a layer of $SiO_2$ with appropriate thickness is deposited onto the sample through Plasma-enhanced Chemical Vapor Deposition (PECVD) after appropriate surface preparation.

In Block 64, a suitable photoresist is spun onto the sample after appropriate surface preparation, and the desired pattern is transferred onto the photoresist along a direction that is suitable for ELO regrowth using a suitable photolithography tool and using a mask designed for this specific purpose. A suitable developer is used to develop the photoresist. The sample is then "descummed" using an oxygen plasma.

In Block 66, the sample is introduced into the ICP tool. $CHF_3$ gas is used as etchant and the sample is immersed into buffered hydrogen fluoride (BHF) solution. The area of the deposited $SiO_2$ layer that is not protected by the photoresist mask is etched under certain conditions to create the textured surface. In areas protected by photoresist, the photoresist is etched at a relatively slower rate. The etch is carried out for a suitable duration so as to obtain a desired etch depth, which is the thickness of the deposited $SiO_2$ layer. Previously established etch rates as well as etching selectivity between photoresist and GaN film are used to determine this duration. Then, the sample is removed from the chamber or solution, and suitable solvents are used to remove the remaining photoresist.

In Block 68, the sample is re-introduced into the MOCVD reactor. The temperature is raised to an estimated wafer surface temperature of ~1050° C., while $NH_3$, $N_2$ and $H_2$ gases are flowed. When the temperature stabilizes, appropriate volumes of TMG and $SiH_4$ are introduced into the gas stream while the chamber pressure is maintained at 76 torr, and the semipolar orientation facets are re-grown on the textured surface.

An example of this step is growing {1 0-1 1} orientation facets on a c-plane GaN template.

Figure 14:
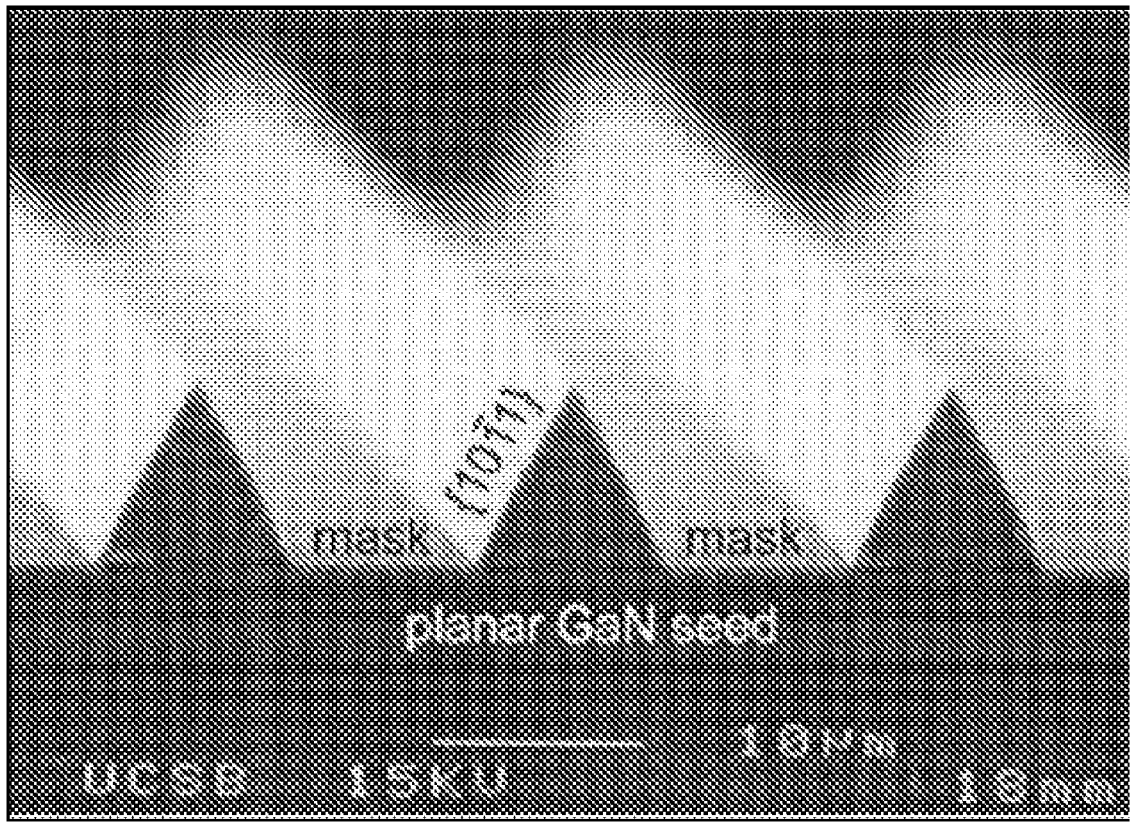
FIG. 14 is a scanning electron microscope image of a {1 0-1 1} facetted surface after initially etching a <1 1-2 0> or <1-1 0 0> GaN facet and then performing GaN regrowth.

First, a 1-3 μm thick GaN layer is grown on a c-plane sapphire substrate using a standard 2-step process. Approximately 200 nm of $SiO_2$ is deposited by PECVD. Subsequently, 5 to 10 μm wide stripes were patterned, with periodicity in the range of 10 to 100 μm, with conventional photolithography, and etched using BHF acid or dry etching techniques. Subsequent MOCVD re-growth was carried out at temperatures in the range of 1015-1100° C. at a reactor pressure of 76 Torr, with a precursor flow for TMG of ~50-100 μmol/min, and a $NH_3$ flow in the range of 1-2 slpm. Then, the {1 0-1 1} facets (or oblique surfaces) are formed (see FIG. 14).

Blocks 58 and 60 are identical in both FIGS. 11 and 13.

Possible Modifications and Variations

The preferred embodiment of this invention starts with a 2-10 μm thick, {0001} oriented GaN template, deposited on a c-plane sapphire substrate by MOCVD. However, any starting template suitable for the epitaxial growth of (Al,In,Ga,B)N layers may be used without deviating from the intent of this invention. Other (Al,In,Ga,B)N alloys may be used as starting templates, including but not limited to AlN or AlGaN alloys. Such templates may be heteroepitaxially grown on a variety of starting substrates, including but not limited to sapphire, SiC, spinel, or silicon substrates; or the template may be homoepitaxially deposited on bulk AlN or GaN substrates. Additionally, bulk AlN or GaN substrates may be used without the prior growth of epitaxial template layers. A variety of techniques may be used to grow the starting template, including but not limited to MOCVD, MBE, HVPE, sublimation, and/or ammonothermal growth.

The starting template may include one or more layers of varying composition and/or doping, which may serve as either active, or passive layers in the final device structure. For example, the starting template may be uniformly Si doped to form the n-type layer of an LED. Or, it may include any number of layers with varying refractive index which form a distributed Bragg reflector for use as a mirror in a microcavity LED. Or, the starting template may consist of laterally epitaxially overgrown layer(s) for defect reduction. These are simply examples and do not constitute an exhaustive list of the numerous variations in starting template layers suitable for this invention. Finally, the thickness of the starting template may be adjusted from 0.5 μm-1000 μm, depending on the intended depth of the etch, requirements of the device structure, or other parameters that do not effect the scope of this invention.

Besides the mask patterns described in the preferred embodiment, a variety of mask patterns may be used to vary the inclination angle of the etched facet. Although the inclined facets described in the preferred embodiment of this invention are intended to correspond to low index crystallographic semipolar planes, any angle of inclination between 5°-90° may be produced for use in this invention.

The preferred embodiment of this invention begins with a {0001} oriented template layer(s). The etching or lateral overgrowth techniques described in this invention result in the formation of inclined facets which may be described as "semipolar." However, additional orientations of the starting template may result in other orientations of the inclined facet. For example, the techniques described in the preferred embodiment of this invention may be applied to planar semipolar {11$\bar{2}$0} templates to produce {1$\bar{1}$00} oriented optoelectronic structures within the scope of this invention.

The optoelectronic devices described in the preferred embodiment of this invention were deposited by MOCVD. However, any of a variety of growth techniques may be used to deposit the same or similar device structures, including but not limited to MBE or HVPE. The number, type, composition, and intentional or unintentional impurity composition of the layers deposited on the inclined facets formed by this invention are not restricted to those described in the preferred embodiment of this invention; the deposited layer(s) depend on the desired properties of the optoelectronic device to be fabricated. The devices which may be fabricated by the techniques described in this invention are not limited to light emitting diodes (LEDs) or laser diodes (LDs); other device structures which benefit from the reduction in internal polarization fields, improved p-type conductivity, and low defect densities achievable with this invention may be produced, including but not limited to microcavity LEDs (MCLEDs), vertical-cavity surface emitting lasers (VCSELs), photovoltaic cells, or high electron mobility transistors (HEMTs).

Following the formation of the inclined facets, the subsequent steps may result in an alteration of the angle of the inclined facet. For example, a thermal annealing step may be used to heal etch damage and produce crystallographic facets. Additionally, subsequent growth steps may tend to reduce the angle of the inclined facets. Therefore, it may be desirable to produce etch facets with a greater angle of inclination than that desired for the intended device. The important feature is that the light emitting layers in the device structure are deposited on a facet inclined with respect to the starting template surface normal. The final structure may or may not include inclined features.

Due to limitations in the techniques used in this invention, the resulting structures may comprise features inclined at one or more angles from 0°-90° with respect to the surface normal, without departing from the scope of this invention. Additionally, it may be desirable to intentionally engineer structures with multiple features with varying inclination angles. For example, oblique surfaces could be formed on only part of the surface of the template or substrate to ensure that some 0° angles remain for regrowth. In another example, it has been shown that devices with a mix of planar and inclined features may be used to produce devices which emit a multiple wavelengths (see U.S. Utility patent application Ser. No. 11/054,271, filed Feb. 9, 2005, by Rajat Sharma, Paul M. Pattison, John F. Kaeding, and Shuji Nakamura, entitled "SEMICONDUCTOR LIGHT-EMITTING DEVICE," which is incorporated by reference herein). The electrical contacts may be designed to connect all device features. Or, they may be designed such that current may be confined to those areas with the desired inclination angle.

In this embodiment, conventional photolithography techniques are used to transform the pattern from the mask. However, due to the limitation of photolithography technology, the width (W) of the stripe on the mask should not be smaller than 1 µm. This limitation leaves a ~1 µm c-plane orientation GaN plateau on the sample after dry etching. Since c-plane orientation GaN plateaus reduce the semipolar orientation facet area, it should be avoided in this invention.

Figure 15:
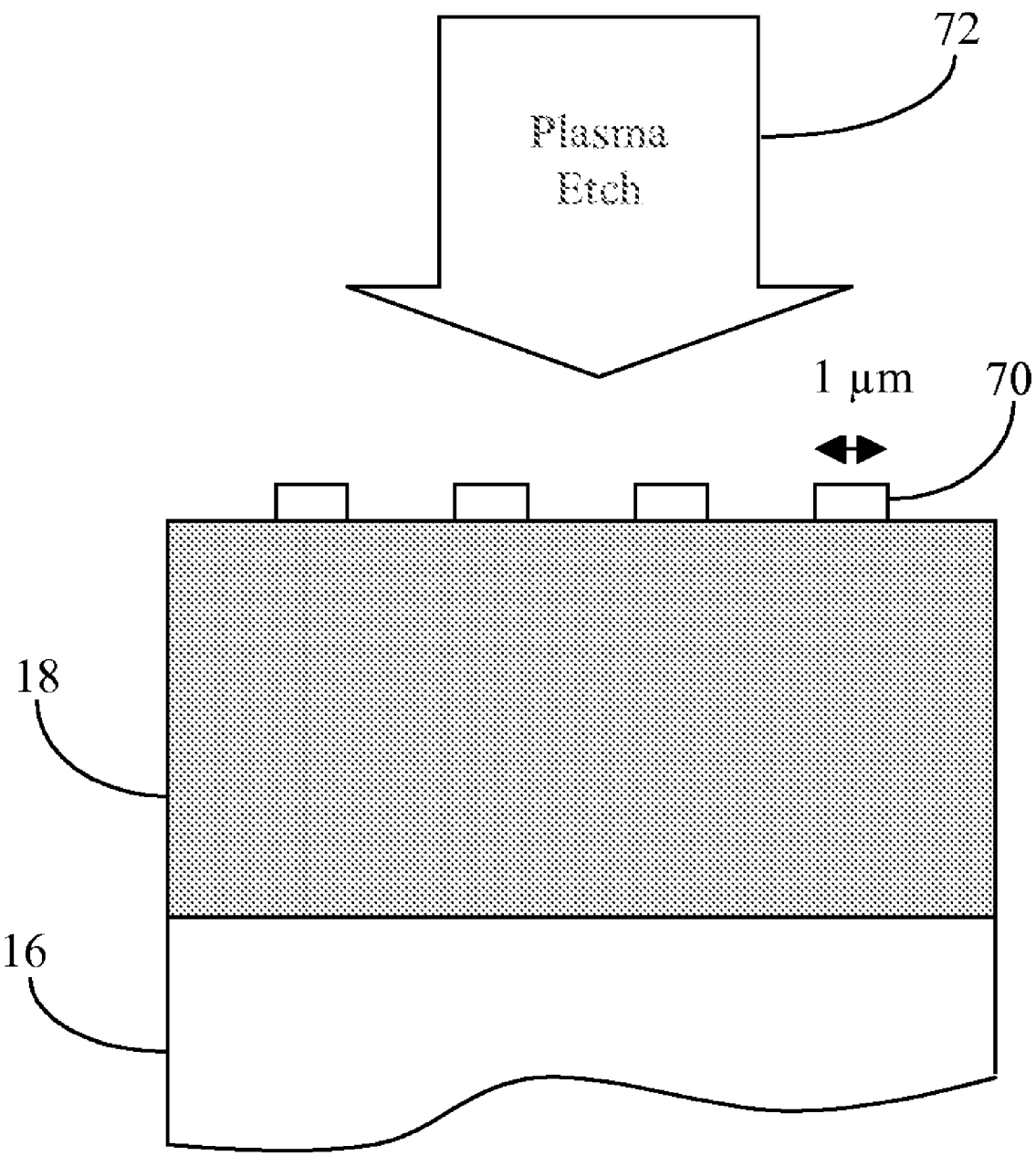
FIG. 15 shows schematically a sample with ~1 μm wide photoresist undergoing etching.
Figure 16:
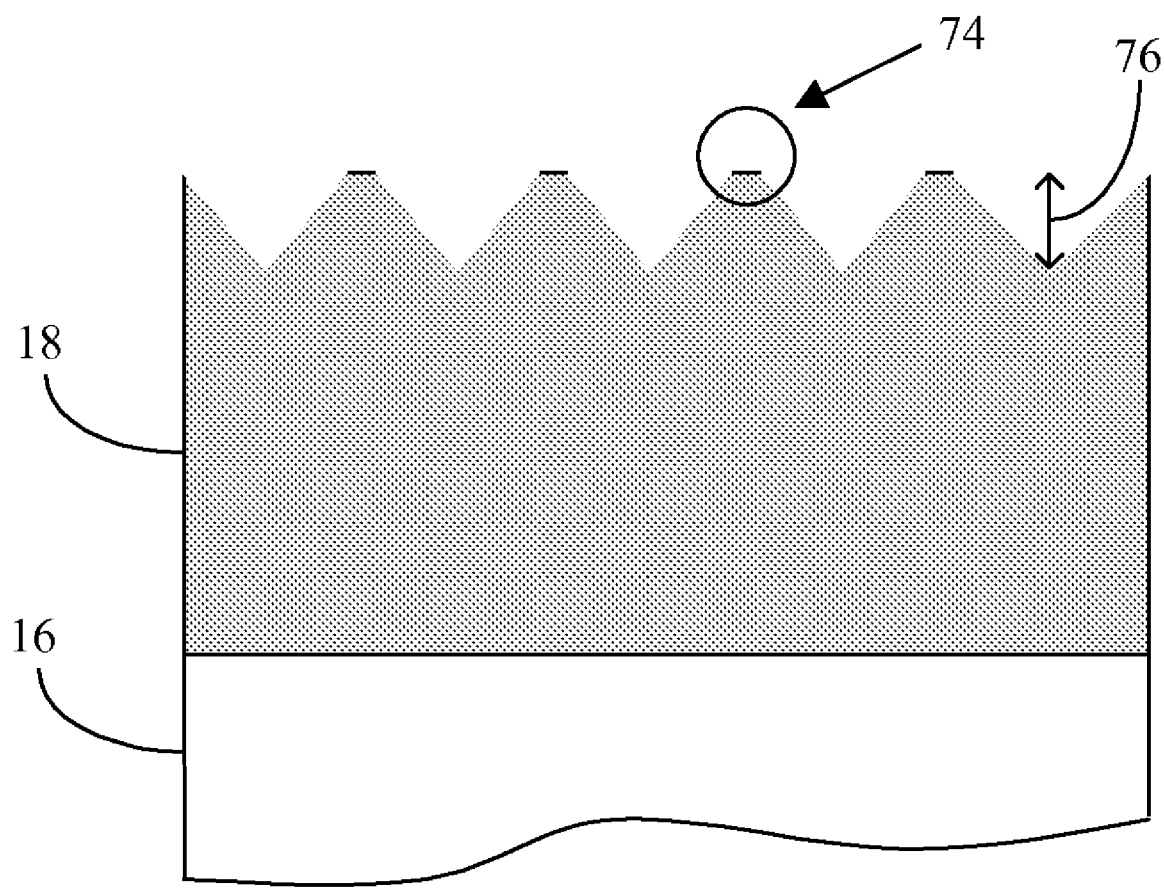
FIG. 16 shows the formation of plateaus on the area covered by the photoresist after etching and solvent clean procedures are performed.

FIGS. 15 and 16 show schematically the process of forming those plateaus, wherein FIG. 15 shows a sample with ~1 µm wide photoresist 70 undergoing etching 72, for example plasma etching, and FIG. 16 shows the formation of plateaus 74 on the area covered by the photoresist after procedures of etching and solvent clean are performed. FIG. 16 also shows the depth 76 of the trenches, grooves or pits formed in the substrate or template by etching one or more areas of a surface of the substrate or template, whose sidewalls are the oblique surfaces.

One possible solution to reduce the width/area of this c-plane GaN plateau is to use nano-imprinting technology. Nano-imprinting lithography (NIL) uses a hard mold, or stamp (which is often created with e-beam lithography using chrome as masking material, followed by ICP/RIE etching), that contains nano-scale features defined on its surface to emboss into a polymer material, using controlled temperatures around the glass transition temperature of the polymer, and pressure. This creates topography on the surface of the polymer, which is further transferred through anisotropic $O_2$ plasma. NIL is capable of printing sub-10 nm features, with the use of relatively simple equipment setup and easy processing. Equipped with such technology, the width of those stripes on chromed mask could be reduced to the nanometer scale, greatly reducing the area of the c-plane GaN plateau.

Another possible modification or variation to the embodiment is the etching system. Although the ICP tool is chosen to perform etches in the preferred embodiment, any other etching tools or techniques may also be suitable.

Besides etching, this invention also employs ELO technique to create the semipolar orientation facets described above. In the preferred embodiment, $SiO_2$ stripes are deposited on the sample for ELO; however, other materials, including but not limited to SiN, may also be used as a substitute for $SiO_2$. In addition, other lateral overgrowth techniques, including but not limited to side-wall epitaxial lateral overgrowth (SELO), or cantilevered epitaxial lateral overgrowth (CELO), may be used to create the semipolar orientation facets.

The method or device of the present invention is not limited to the nitride material system.

General Process Steps

Figure 19:
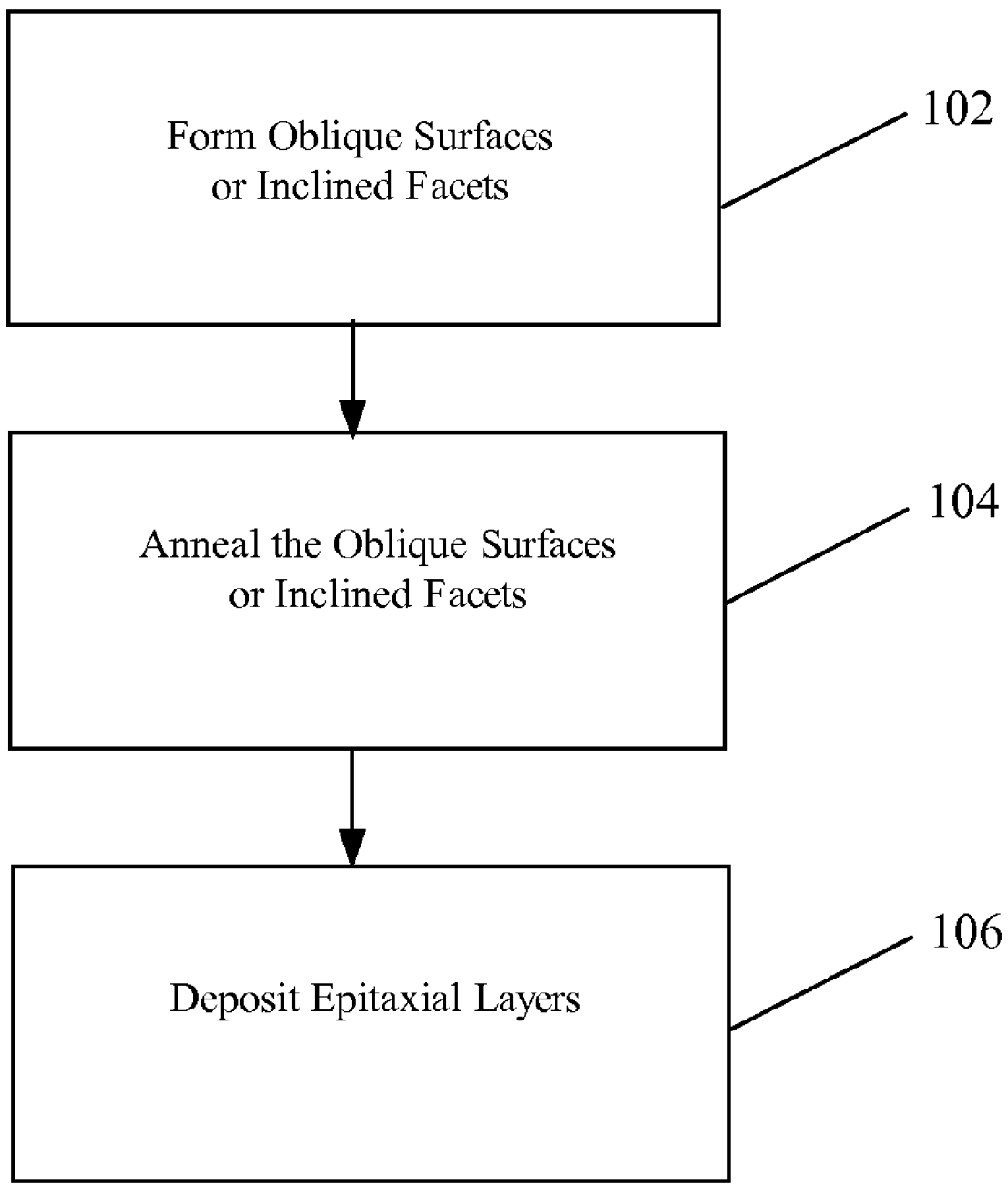
FIG. 19 is a flowchart illustrating a method for fabricating a semiconductor device having one or more crystallographic orientations.

FIG. 19 is a flowchart illustrating a general method for fabricating a semiconductor device having one or more crystallographic orientations, in contrast to the specific methods described above.

Block 102 represents the step of forming one or more oblique surfaces or inclined facets of a substrate or template.

The forming step may comprise etching the template or substrate, for example, etching one or more areas of a surface of the template or substrate to form, for example, grooves, trenches or pits whose sidewalls are the inclined facets. The etching step may comprise masking areas on the substrate or template, to create masked and unmasked areas, and etching the substrate or template through the unmasked areas to form the oblique surfaces or inclined facets, and wherein the masked areas are etched at a relatively slower rate than the unmasked areas. The etching may be to a maximum depth in a range between 1 nanometer and 10 microns which determines a surface area of the oblique surfaces, and wherein a width of the areas that are etched (for example, the unmasked areas) is in a range between 3 and 10 microns and determines an angle of inclination of the oblique surfaces or inclined surfaces. The masked areas may be stripes having a spacing, for example, in the range 3-10 microns, that determines an inclination angle of the oblique surfaces or inclined facets.

The forming step may also comprise performing an epitaxial lateral overgrowth of the substrate or template, wherein the epitaxial lateral overgrowth comprises standard lateral epitaxial overgrowth (LEO), side-wall epitaxial lateral overgrowth (SELO), or cantilevered epitaxial lateral overgrowth (CELO), and terminating the epitaxial lateral overgrowth before adjacent overgrowth stripes coalesce, wherein one or more surfaces of the epitaxial overgrowth comprise the oblique surfaces or inclined facets.

Block 104 represents the step of annealing the oblique surfaces or inclined facets to create crystallographic facets, with semipolar orientation, for example.

Block 106 represents the step of depositing one or more epitaxial layers, for example nitride or (Al, In, Ga, B)N layers, on the oblique surfaces, inclined facets or annealed facets. The epitaxial layers nay be deposited using any deposition technique, for example, metalorganic chemical vapor deposition (MOCVD), molecular beam epitaxy, sublimation, vapor phase epitaxy, or ammonothermal growth. The method can be used to fabricate a device, for example, a substrate for further deposition of epitaxial layers, a light emitting device such as an LED or a LD, a photovoltaic cell, a HEMT, or a device which would benefit from a reduction in internal polarization fields or increased hole mobility.

Advantages and Improvements Over Existing Practice

The existing practice for III-nitride device fabrication is to grow GaN with the c-plane normal to the surface. This plane has a spontaneous polarization and piezoelectric polarization, both of which are detrimental to device performance. The advantage of semipolar over c-plane nitride films is the reduction in polarization and the associated increase in internal quantum efficiency for certain devices.

Nonpolar planes could be used to completely eliminate polarization effects in devices. However, these planes are quite difficult to grow, and thus nonpolar nitride devices are not currently in production. The advantage of semipolar over nonpolar nitride films is the ease of growth. We have found that semipolar planes have a large parameter space in which they will grow. For example, nonpolar planes will not grow at atmospheric pressure, but semipolar planes have been experimentally demonstrated to grow at pressures from 62.5 torr to 760 torr, and probably have an even wider pressure range.

Although growing planar semipolar GaN looks promising, current growth techniques are far from sophisticated, and more work needs to be performed determining optimal growth conditions and best substrate materials.

Also, nonpolar/semipolar p-type GaN has a higher hole concentration, which is important in fabricating high quality LEDs and LDs. [6]

One approach of this invention utilizes the sophisticated c-plane GaN growth techniques, along with some etching techniques, to create semipolar orientation GaN facets for device-structure re-growth by, including but not limited to MOCVD and MBE. The other approach of this invention uses sophisticated c-plane GaN ELO techniques to create semipolar facets for device structure re-growth.

Examples of advantages of the current invention are outlined below:

a. It is believed that the present invention is the first to provide electrically-injected semipolar orientation optoelectronic devices, comprising a light emitting layer, that are grown on semipolar facets.

b. The present invention reduces crystal defects for homoepitaxial growth.

c. The present invention provides greater latitude in choosing semipolar plane for devices.

d. The faceted surface after device structure regrowth may enhance light extraction efficiency.

Figure 17:
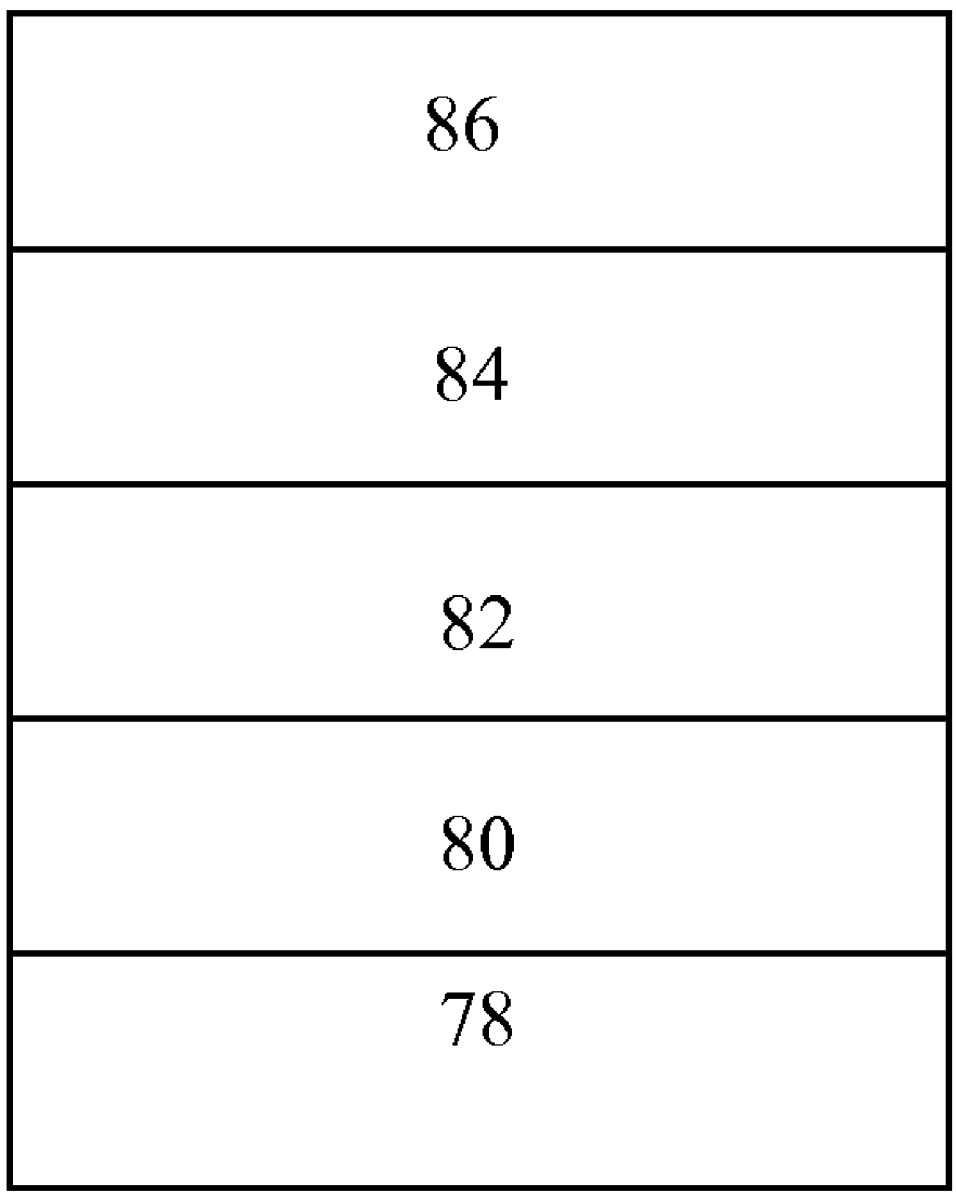
FIG. 17 is a schematic of an LED epitaxial structure.

FIG. 17 is a schematic of an LED epitaxial structure according to the preferred embodiment of the present invention, which comprises a buffer layer 78 (for example, a 30 nm GaN buffer layer), an n-type layer 80 (for example, a 4 µm n-GaN layer), a quantum well region 82 (for example, a 3 nm undoped $In_xGa_{1-x}N$ MQW layer, where x=0.45), a first p-type layer 84 (for example, a 100 nm $p-Al_xGa_{1-x}N$ layer where x=0.20), and a second p-type layer 86 (for example, a 0.5 µm p-GaN layer).

Figure 18:
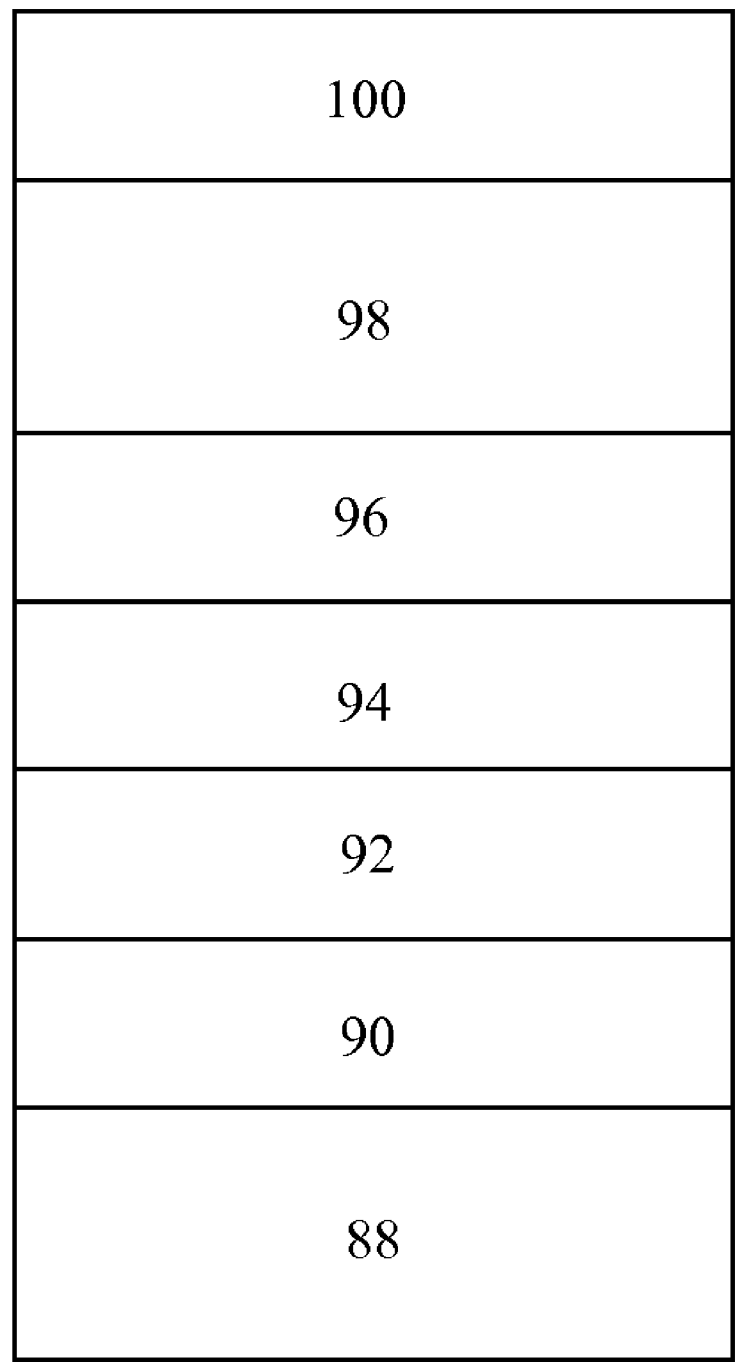
FIG. 18 is a schematic of a laser diode (LD) epitaxial structure.

FIG. 18 is a schematic of a LD epitaxial structure according to the preferred embodiment of the present invention, which comprises an n-GaN layer 88 (for example, a 5 µm n-GaN layer), an AlGaN layer 90 (for example, 1.0 µt AlGaN:Si layer), a first guide layer 92 (for example 0.1 µm n-GaN), an active region 94 (for example, a 3x nm InGaN MQW layer), a second guide layer 96 (for example, 0.1 µm p-GaN), an SLS layer 98 (for example, 2.5 nm/25. nm/0.5 µm p-(AlGaN/GaN) SLS layer, and p-GaN layer 100 (for example, a 0.1 µm p-GaN layer).

REFERENCES

The following references are incorporated by reference herein:

1. Nishizuka, K., et al., Applied Physics Letters, Vol. 84, No. 15 (2004).
2. Nishizuka, K., et al., Applied Physics Letters, Vol. 87, No. 11 (2005).
3. Sharma, R. et al., Applied Physics Letters, Vol. 87, No. 9 (2005).
4. Japanese Journal of Applied Physics, Vol. 44, No. 29, pp. L920-L922: (A13, H04) (2005).
5. Troy J. Baker, Benjamin A. Haskell, Feng Wu, Paul T. Fini, James S. Speck and Shuji Nakamura, "Characterization of Planar Semipolar Gallium Nitride Films on Spinel Substrates," Japanese Journal of Applied Physics, Vol. 44, No. 29 (2005).
6. M. McLaurin, T. E. Mates, and J. S. Speck, "Molecular-beam epitaxy of p-type m-plane GaN," Applied Physics Letters, 86, 262104 (2005).
7. Romanov, A., Fini, P., Speck, J., Journal of Applied Physics, Vol. 93, No. 1 (2003).
8. Fini. P, "Threading Dislocation Reduction in Gallium Nitride Thin Films on Sapphire Via Lateral Epitaxial Overgrowth," PhD Thesis, University of California, Department of Engineering, p. 61 (2000).
9. Tojyo, Tsuyoshi. Jpn. J. Appl. Phys., Vol. 40, pp. 3206-3210 (2001).
10. Nakamura, S. et al, "The Blue Laser Diode—the complete story," Springer, 2000, $2^{nd}$ edition, page 280.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic device, comprising:
   (a) a plurality of oblique surfaces formed on a surface of a GaN layer, wherein the plurality of oblique surfaces have a plurality of inclination angles, the plurality of oblique surfaces provide a growth surface for subsequent layers, the GaN layer is between the subsequent layers and an underlayer, and an interface of the GaN layer with the underlayer is a c-plane.

2. The device of claim 1, wherein the oblique surfaces are semipolar or nonpolar planes.

3. The device of claim 1, wherein the oblique surfaces comprise $\{11\bar{2}2\}$, $\{10\bar{1}1\}$, $\{10\bar{1}3\}$, $\{10\bar{1}2\}$, $\{20\bar{2}1\}$, or $\{10\bar{1}4\}$ planes.

4. The device of claim 1, wherein the underlayer is a c-plane substrate or template.

5. The device of claim 1, wherein the oblique surfaces are etched oblique surfaces of the GaN layer.

6. The device of claim 1, wherein the oblique surfaces are sidewalls or facets of trenches, grooves, or pits in the surface of the GaN layer.

7. The device of claim 6, wherein the trenches, grooves, or pits have a maximum depth not greater than 10 microns and a spacing in a range between 3 and 10 microns.

8. The device of claim 1, further comprising:
(b) one or more active layers formed epitaxially on the oblique surfaces or on one or more epitaxial layers formed on the oblique surfaces.

9. The device of claim 8, wherein the active layers or epitaxial layers are homoepitaxial or regrowths.

10. The device of claim 8, wherein the device is a substrate, light emitting diode (LED), laser diode (LD), an electrically injected device, other device where the active layers are light emitting, a high electron mobility transistor, or a device which would benefit from a reduction in internal polarization fields or increased hole mobility.

11. The device of claim 8, further comprising:
(c) one or more n-type nitride layers; and
(d) one or more p-type nitride layers,
(e) wherein the active layers are light emitting and nitride based, and positioned between the n-type nitride layers and the p-type nitride layers.

12. The device of claim 8, further comprising:
(c) an n-type waveguide layer;
(d) a p-type waveguide layer;
(e) one or more n-type layers above or below the n-type waveguide layer; and
(f) one or more p-type layers above or below the n-type waveguide layers.
(g) wherein the active layers are light emitting and positioned between the n type waveguide layer and the p-type waveguide layer.

13. The device of claim 8, wherein at least one of the active layers, substrate, template, or epitaxial layers comprise (Al, Ga, In, B)N-based material or is suitable for growth of (Al, Ga, In, B)N material.

14. The device of claim 8, wherein the active layers are comprised of multi quantum well (MQW) layers comprising indium.

15. The device of claim 8, wherein the epitaxial layers or template, or both the epitaxial layers and template, comprise n-type or p-type material.

16. The device of claim 8, further comprising one or more n-type or p-type layers above the active layers.

17. An optoelectronic device, comprising:
a plurality of oblique surfaces, formed on a surface of a GaN layer, wherein the plurality of oblique surfaces have a plurality of inclination angles, the plurality of oblique surfaces provide a growth surface for subsequent layers, the oblique surfaces are surfaces of epitaxial lateral overgrowths of the GaN layer, and a majority of the growth surface is different from a c-lane.

18. A method for fabricating an optoelectronic device having one or more crystallographic orientations, comprising:
(a) forming a plurality of oblique surfaces on a surface of a GaN layer, wherein the plurality of oblique surfaces have a plurality of inclination angles, the plurality of oblique or facetted surfaces provide a growth surface for subsequent layers, the GaN layer is between the subsequent layers and an underlayer, and an interface of the GaN layer with the underlayer is a c-plane.

19. The method of claim 18, wherein the oblique surfaces are formed with a semipolar or nonpolar orientation.

20. The method of claim 18, wherein the GaN layer comprises (Al,Ga,In,B)N material or is suitable for growth of nitride material, or the GaN layer is bulk aluminium nitride or gallium nitride, or both the GaN layer comprise (Al,Ga,In, B)N material or are suitable for growth of (Al, Ga, In, B)N material.

21. The method of claim 18, wherein the underlayer is a c-plane template or substrate.

22. The method of claim 18, wherein the GaN layer comprises one or more n-doped or p-doped layers of a device, or one or more layers with varying refractive index to form a distributed Bragg reflector.

23. The method of claim 18, wherein the forming comprises etching the GaN layer.

24. The method of claim 23, wherein the etching is dry etching and a greater inclination for the oblique surfaces is achieved by a greater degree of chemical etching and a lesser degree of physical etching.

25. The method of claim 23, wherein the etching comprises etching one or more areas of a surface of the GaN layer to form pits, trenches or grooves having sidewalls which are the oblique surfaces.

26. The method of claim 23, wherein:
(1) the etching comprises etching one or more areas of a surface of the GaN layer to a maximum depth in a range between 1 nanometer and 10 microns which determines a surface area of the oblique surfaces; and
(2) the areas have a width in a range between 3 and 10 microns which determines an angle of inclination of the oblique surfaces.

27. The method of claim 23, wherein the etching further comprises:
(1) masking areas on the GaN layer, to create masked and unmasked areas; and
(2) etching the GaN layer through the unmasked areas, wherein the masked areas are etched at a relatively slower rate than the unmasked areas.

28. The method of claim 27, wherein the masked and unmasked areas are formed using nanoimprinting.

29. The method of claim 27, wherein the masked areas are stripes having a spacing that determines an inclination angle of the oblique surfaces.

30. The method of claim 29, wherein the spacing ranges between 3 and 10 microns.

31. The method of claim 18, wherein the oblique surfaces do not all have a same orientation.

32. The method of claim 18, wherein the oblique surfaces are formed with an inclination angle in the range 25 to 50 degrees.

33. The method of claim 18, further comprising annealing the oblique surfaces after the forming step (a) to create crystallographic facets with semipolar orientation.

34. The method of claim 18, further comprising:
(b) depositing one or more epitaxial layers on the oblique surfaces formed in step (a).

35. The method of claim 34, wherein the oblique surfaces are formed with an inclination angle larger than is desired because the depositing step (b) reduces the inclination angle to the desired inclination angle.

36. The method of claim 34, wherein metalorganic chemical vapor deposition, molecular beam epitaxy, sublimation, vapor phase epitaxy, or ammonothermal growth are used to deposit the epitaxial layers.

37. The method of claim 34, wherein at least the first epitaxial layer is regrown or homoepitaxially deposited.

38. The method of claim 34, wherein the epitaxial layers comprise at least one of the following: one or more n-type layers, one or more p-type layers, or one or more (Al,In,Ga, B)N layers.

39. The method of claim 34, wherein the depositing step (b) further comprises:
  (1) regrowing an n-type gallium nitride (GaN) layer on the oblique surfaces using metalorganic chemical vapor deposition (MOCVD), at a raised wafer temperature of approximately 1050° C., under a flow of hydrogen, nitrogen and ammonia;
  (2) lowering the wafer temperature to approximately 800° C. and depositing one or more light emitting (In,Ga)N layers on the regrown n-type GaN layer; and
  (3) depositing one or more further device layers on the light emitting (In,Ga)N layers.

40. The method of claim 34, wherein the depositing step (b) results in a final surface which is substantially planar.

41. A device fabricated using the method of claim 18.

42. The device of claim 41, wherein the device is a substrate, light emitting diode, a laser diode, a photovoltaic cell, a high electron mobility transistor, or a device which would benefit from a reduction in internal polarization fields or increased hole mobility.

43. A method for fabricating an optoelectronic device, comprising:
  (a) performing an epitaxial lateral overgrowth of a GaN layer, wherein the epitaxial lateral overgrowth comprises lateral epitaxial overgrowth (LEO), side-wall epitaxial lateral overgrowth (SELO), or cantilevered epitaxial lateral overgrowth (CELO); and
  (b) terminating the epitaxial lateral overgrowth before adjacent overgrowth stripes coalesce, wherein one or more surfaces of the epitaxial overgrowth comprise a plurality of oblique surfaces, the plurality of oblique surfaces have a plurality of inclination angles, the plurality of oblique surfaces provide a growth surface for subsequent layers, and a majority of the growth surface is different from a c-plane.

* * * * *